United States Patent
Matsui

(10) Patent No.: US 7,811,920 B2
(45) Date of Patent: Oct. 12, 2010

(54) SEMICONDUCTOR DEVICE HAVING A THROUGH ELECTRODE, SEMICONDUCTOR MODULE EMPLOYING THEREOF AND METHOD FOR MANUFACTURING SEMICONDUCTOR DEVICE HAVING A THROUGH ELECTRODE

(75) Inventor: Satoshi Matsui, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 215 days.

(21) Appl. No.: 12/210,551

(22) Filed: Sep. 15, 2008

(65) Prior Publication Data

US 2009/0075478 A1 Mar. 19, 2009

Related U.S. Application Data

(62) Division of application No. 11/290,433, filed on Dec. 1, 2005, now Pat. No. 7,436,069.

(30) Foreign Application Priority Data

Dec. 2, 2004 (JP) ............... 2004-349688

(51) Int. Cl.
*H01L 21/44* (2006.01)

(52) U.S. Cl. ............... 438/612; 257/E21.012; 257/693

(58) Field of Classification Search ............ None
See application file for complete search history.

(56) References Cited

U.S. PATENT DOCUMENTS

| 5,276,343 | A | 1/1994 | Kumagai et al. |
| 5,899,734 | A | 5/1999 | Lee |
| 6,365,452 | B1 | 4/2002 | Perng et al. |
| 6,420,751 | B1 | 7/2002 | Maeda et al. |
| 6,544,833 | B2 | 4/2003 | Kawakubo |
| 6,987,043 | B2 | 1/2006 | Kujirai et al. |
| 7,115,972 | B2 | 10/2006 | Dotta et al. |
| 7,291,911 | B2 * | 11/2007 | Usami ............ 257/693 |
| 7,323,785 | B2 | 1/2008 | Uchiyama |
| 7,488,674 | B2 * | 2/2009 | Usami ............ 438/613 |
| 2002/0190375 | A1 | 12/2002 | Mashino et al. |
| 2004/0212086 | A1 | 10/2004 | Dotta et al. |
| 2004/0248362 | A1 | 12/2004 | Nakamura et al. |
| 2004/0262767 | A1 | 12/2004 | Matsuo |
| 2005/0136568 | A1 | 6/2005 | Fukazawa |
| 2006/0001174 | A1 | 1/2006 | Matsui |
| 2006/0006539 | A1 | 1/2006 | Matsui et al. |
| 2006/0128155 | A1 | 6/2006 | Miyata et al. |
| 2006/0220230 | A1 | 10/2006 | Tanaka et al. |
| 2007/0134819 | A1 | 6/2007 | Uchiyama |
| 2008/0067665 | A1 | 3/2008 | Aziz et al. |

FOREIGN PATENT DOCUMENTS

| EP | 1191596 | 3/2002 |
| JP | 4-302470 | 10/1992 |
| JP | 2002-043502 | 2/2002 |
| JP | 2002-83945 | 3/2002 |
| JP | 2002-289623 | 10/2002 |
| JP | 2003-007909 | 1/2003 |

* cited by examiner

*Primary Examiner*—Jarrett J Stark
*Assistant Examiner*—Nicholas Tobergte
(74) *Attorney, Agent, or Firm*—Young & Thompson

(57) ABSTRACT

The layout density of the through electrodes in the horizontal plane of the substrate is enhanced. Through holes 103 extending through the silicon substrate 101 is provided. An insulating film 105 is buried within the through hole 103. A plurality of columnar through plugs 107 are provided in the insulating film 105.

6 Claims, 23 Drawing Sheets

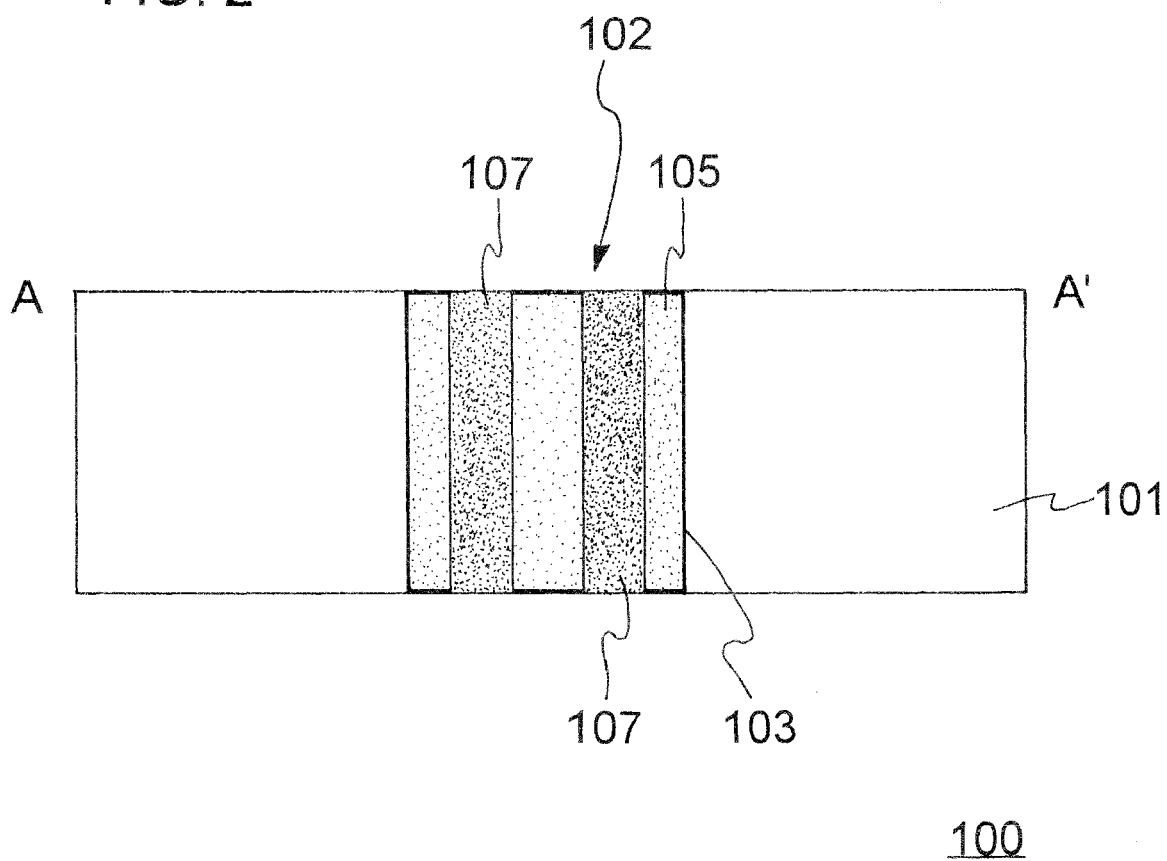

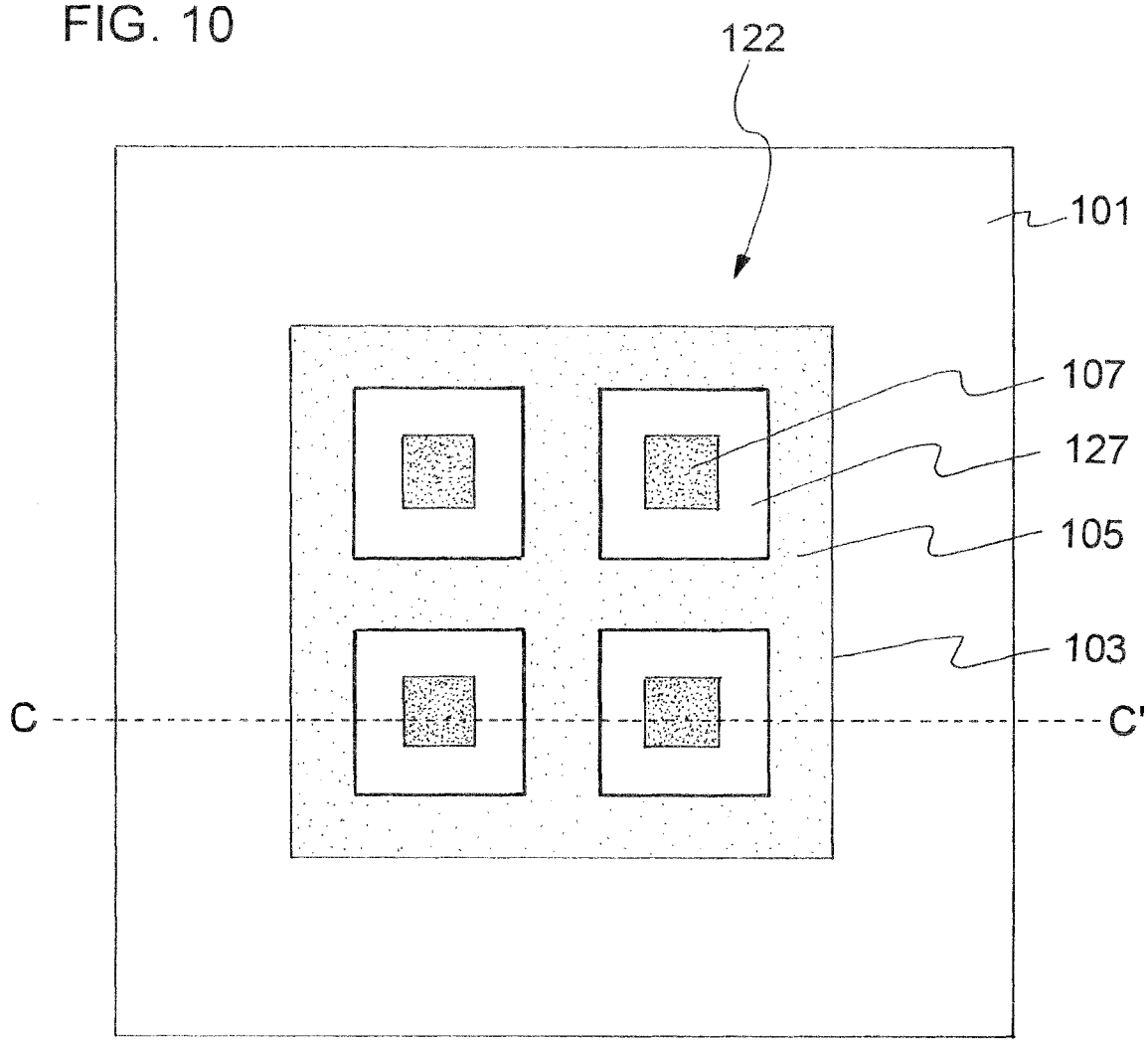

SEMICONDUCTOR DEVICE HAVING A THROUGH ELECTRODE, SEMICONDUCTOR MODULE EMPLOYING THEREOF AND METHOD FOR MANUFACTURING SEMICONDUCTOR DEVICE HAVING A THROUGH ELECTRODE

This application is based on Japanese patent application No. 2004-349, 688, the content of which is incorporated hereinto by reference.

BACKGROUND

1. Technical Field

The present invention relates to a semiconductor device comprising a through electrode, a semiconductor module employing thereof and a method for manufacturing a semiconductor device.

2. Related Art

In the conventional technology, a bare chip stack-type multiple-chip module (MCM) has been proposed for the purpose of achieving a higher degree of integration in a system-in-package (Sip) arrangement in which chips are in parallel or of a package-stack type. An interconnect extending through the semiconductor substrate is essential for the bare chip stack-type module. Exemplary conventional bare chip stack-type MCMs having a through electrode are described in Japanese Patent Laid-Open No. 2003-7,909.

Japanese Patent Laid-Open No. 2003-7,909 describes a semiconductor device comprising a columnar plug that extends through the semiconductor chips. In this semiconductor device, a single plug is buried within a single opening of a semiconductor substrate, and one interconnect is disposed corresponding to one plug.

Japanese Patent Laid-Open No. 2002-43,502 describes a semiconductor chip having a ring-shaped chip through plug, which is formed by forming a slit-shaped concave portion in a Si wafer, and providing a geometry of the slit of a cylinder (annular cross section). Japanese Patent Laid-Open No. 2002-43,502 also describes a chip through plug having a dual ring-shaped chip through plug and having a structure including a column of silicon in the center thereof that is remained therein. The ring-type chip through plug is formed by forming a ring-shaped concave portion in the Si wafer so that a convex Si wafer is remained therein, providing an insulating film covering each of the side surfaces and a bottom surface of the concave portion and a Cu film, and filling the slit-shaped concave portion by conducting an electrolytic plating from an origin of the Cu film to grow Cu. It is described that an improvement in the filling characteristic of the plug materials can be presented by forming the slit-shaped concave portion, and thereby providing an improved throughput.

SUMMARY OF THE INVENTION

However, since the technology described in Japanese Patent Laid-Open No. 2003-7,909 utilizes a configuration, in which one plug corresponds to one interconnect, it is difficult to provide an improvement in the density of the arranged plugs. In addition, a reduction of a parasitic capacitance is difficult.

Further, in the case of semiconductor chip described in Japanese Patent Laid-Open No. 2002-43,502, a region required for disposing one chip through plug is larger, and thus it is difficult to improve the density of the chip through plugs even though a dual ring-shaped slit via is provided.

As described above, these conventional technologies have left rooms for improvement, in view of the difficulty in providing much through electrodes at higher density while achieving the miniaturization of the through electrode. The present invention is made in view of the above-described situations and provides an improved density of the through electrodes in a horizontal plane of the substrate.

According to one aspect of the present invention, there is provided a semiconductor device, comprising: a semiconductor substrate; a through hole extending through the semiconductor substrate; an insulating film buried in the through hole; and a plurality of columnar electrically conducting plugs provided in the insulating film.

In the semiconductor device according to the above described aspect of the present invention, a plurality of columnar electrically conducting plugs are provided in the through hole having the insulating film buried therein. Therefore, the electrically conducting plugs insulated each other can be collectively disposed in one through hole. Thus, an improved density of the electrically conducting plugs in the horizontal plane of the semiconductor substrate can be presented.

In such case, the semiconductor device according to the present invention may be sufficient to have the above-described configuration, and is not limited to devices having an active element such as a transistor formed in the device. For example, a silicon interposer or the like may be included in the semiconductor device of the present invention. Here, in the specification, the interposer means a plate member that can be utilized in the stacked-type semiconductor device for providing an electrical connection between the stacked semiconductor devices, and has a substrate and a through electrode extending through the silicon substrate. The through electrode is electrically connected to a conductive member of the semiconductor device provided on the upper portion of the interposer. In addition, the interposer may have a configuration including an element except the active element like transistors mounted therein, and more specifically, for example, passive components such as interconnect, capacitor, inductor, antenna and the like, or otherwise, the interposer may have a configuration including no passive component.

In addition, in this specification, "columnar" for electrically conducting plug indicates a condition where no other material is filled in the interior of the electrically conducting plug. As a typical configuration of "not columnar" may be an annular cylindrical geometry such as an annular cross-sectional geometry. The level of the degree of integration of the electrically conducting plugs can be improved by having the columnar shaped electrically conducting plug. The preferable geometries for enhancing the degree of integration of the electrically conducting plugs therein may include for example, cylinder, cylindroid, or prisms such as quadratic prism octagonal prism and the like. By selecting such geometries, a plurality of electrically conducting plugs can be packed in the through hole at higher density. In addition, the geometry of the electrically conducting plug may be a stripe pattern, in which an electrically conducting film is buried within a slit formed in an insulating film. By selecting such geometry, the configuration allowing efficient filling of the electrically conducting film can be presented.

According to another aspect of the present invention, there is provided a semiconductor module, comprising a stacked structure of the above-described semiconductor device and other semiconductor device, wherein the plurality of electrically conducting plugs are connected to a conductive member of the other semiconductor device adjacent to the semiconductor device. According to the semiconductor module of the present invention, a plurality of semiconductor devices can be electrically connected at higher density by short distances.

According to further aspect of the present invention, there is provided a method for manufacturing a semiconductor device, comprising: providing a first hole in one surface of a semiconductor substrate; providing an insulating film on the semiconductor substrate to fill the first, hole; providing a plurality of second holes in the insulating film from the one surface; forming a first electrically conducting film to fill a plurality of the second holes; reducing a thickness of the semiconductor substrate from the other surface of the semiconductor substrate; and exposing the first electrically conducting film.

Since the method includes providing a plurality of second holes in the insulating film buried in the first hole according to the present invention, the first electrically conducting film can be collectively disposed in the insulating film at higher density.

According to yet other aspect of the present invention, there is provided a method for manufacturing a semiconductor device, comprising: providing a first hole in one surface of a semiconductor-substrate and providing a portion of the semiconductor substrate remaining in the inside of the first hole; providing an insulating film, on the semiconductor substrate to fill the first hole; providing a plurality of second holes in the portion of the semiconductor substrate remaining in the inside of the first hole from the one surface; forming a first electrically conducting film to fill the plurality of second holes; reducing a thickness of the semiconductor substrate from the other surface of the semiconductor substrate; and exposing the first electrically conducting film.

Since the method according to the present invention includes providing a remaining portion of the semiconductor substrate in the inside of the first hole, the first electrically conducting film can be collectively disposed in the insulating film through the semiconductor substrate remaining in the inside of the first hole at higher density. Alternatively, in the present invention, a plurality of second holes may be provided in one of the regions where the semiconductor substrate remains, or one or more second holes may also be provided in each of the plurality of regions where semiconductor substrate remains.

Further, the process for reducing the thickness of the semiconductor substrate and the process for exposing the first electrically conducting film may be conducted in one process.

It is to be understood that the invention is capable of use in various other combinations and modifications, and any other exchanging of the expression between the method and device or the like according to the present invention may be effective as an alternative of an embodiment according to the present invention.

The technology for providing an improved arrangement density of the through electrodes in the horizontal plane of the substrate can be achieved by providing a plurality of columnar electrically conducting plugs in the insulating film buried in the through hole extending through the semiconductor substrate according to the present invention.

BRIEF DESCRIPTION OF THE DRAWINGS

The above and other objects, advantages and features of the present invention will be more apparent from the following description taken in conjunction with the accompanying drawings, in which:

FIG. 2 is an cross-sectional view of FIG. 1 along A-A';

FIG. 10 is a plan view, schematically showing a configuration of a semiconductor device according to an embodiment of the present invention;

DETAILED DESCRIPTION

Figure 1:
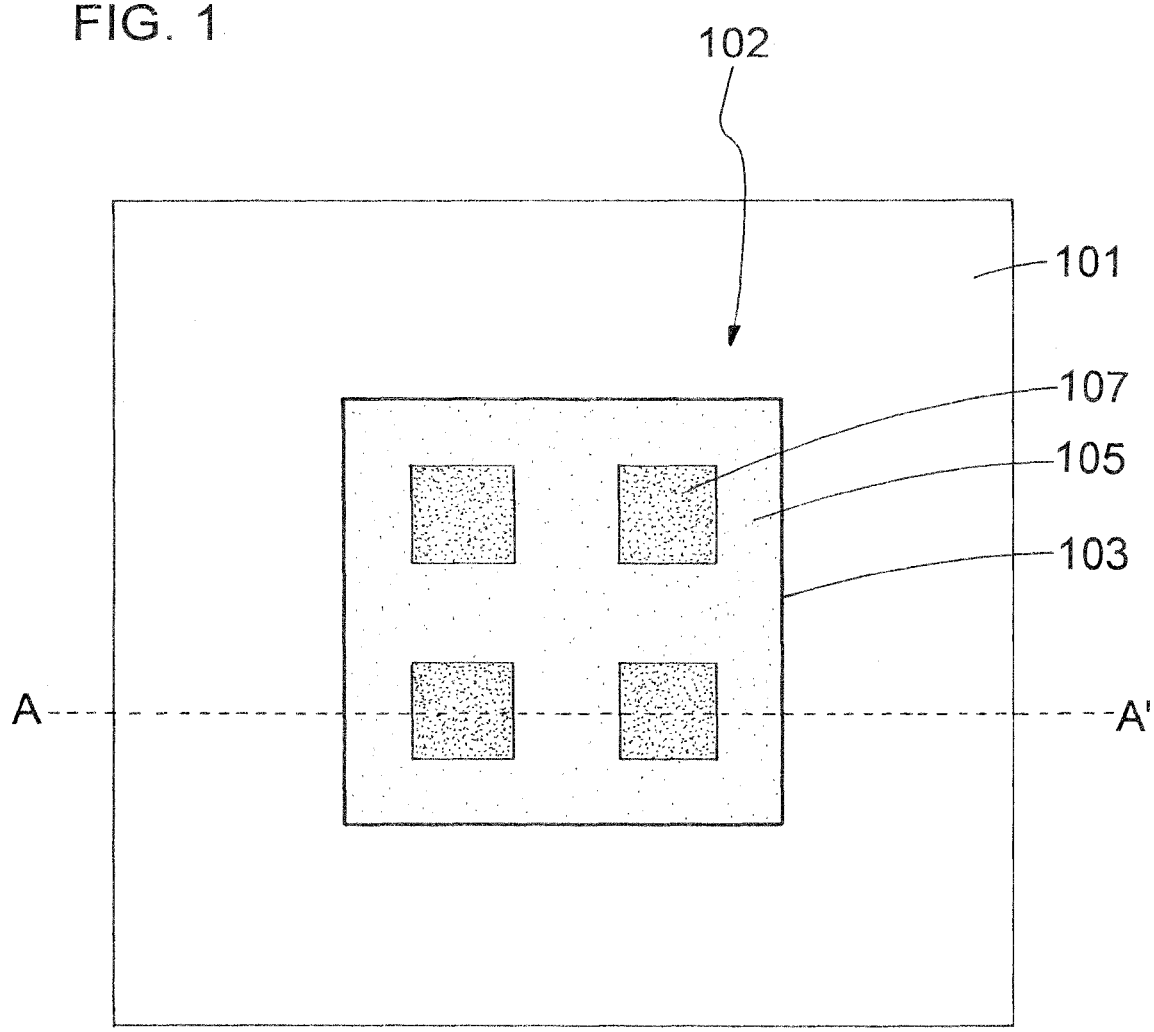
FIG. 1 is a plan view, schematically showing a configuration of a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated.

The semiconductor device according to the present invention may have a configuration, in which at least one of the plurality of electrically conducting plugs is buried in the insulating film so that the entire side surface thereof is in contact with the insulating film. Having such configuration, an insulation of the side surface of the electrically conducting plug can be more surely presented.

The semiconductor device according to the present invention may have a configuration, in which the semiconductor device further comprises a capacitor element including the plurality of adjacent electrically conducting plugs and the insulating film that provides an isolation among the plurality of adjacent electrically conducting plugs. Having such configuration, the capacitor element can be stably manufactured in a simple process.

The semiconductor device according to the present invention may have a configuration, in which a portion of the semiconductor substrate is remained to cover the entire side surface of at least one of the plurality of electrically conducting plugs. This can provide the configuration providing an enhanced manufacturing facility.

The semiconductor device according to the present invention may have a configuration, in which the electrically conducting plug is formed to fill the electrically conducting film, contacting with a hole provided in the remained, portion, of the semiconductor substrate. This can provide the configuration providing a simplifies manufacturing process.

The semiconductor device according to the present invention may have a configuration, in which a plurality of the electrically conducting plugs are provided in the portion of the remained semiconductor substrate, and wherein the semiconductor device further comprises a capacitor element including the plurality of adjacent electrically conducting plugs and the portion of the substrate that provides an isolation among the plurality of adjacent electrically conducting plugs. Having such configuration, the capacitor element having larger capacitance can be provided with a simple constitution.

The semiconductor device according to the present invention may have a configuration, in which the plurality of electrically conducting plugs having rectangular cross-sections in a horizontal surface of the semiconductor substrate are provided, in a mutually parallel pattern. Having such configuration, the degree of integration of the electrically conducting plugs can be further improved. In addition, for example, it can be designed to have larger ratio of adjacent sides of the rectangular portion to provide a stripe patterned electrically conducting plug. This can provide further improved filling characteristic.

The semiconductor device according to the present invention may have a configuration, in which cross sectional geometries of the plurality of electrically conducting plugs are same. The degree of integration can be more surely improved by providing a plurality of columnar electrically conducting plugs having the same geometry.

The semiconductor device according to the present invention may have a configuration, in which the plurality of electrically conducting plugs are disposed in a lattice pattern. Having such configuration, the degree of integration of the electrically conducting plugs can be further surely improved.

Here, in this specification, "disposed in a lattice pattern" means a status where a plurality of electrically conducting plugs are periodically or regularly arranged in the horizontal plane of the substrate. Typical arrangement of the lattice pattern may include, for example, an arrangement of tetragonal, lattice pattern. In addition, an arrangement of diagonal lattice pattern such as a staggered lattice may also be employed.

The semiconductor device according to the present invention may have a configuration, in which the semiconductor device comprises the plurality of electrically conducting plugs having substantially different cross sectional geometries in the horizontal plane of the semiconductor substrate. The semiconductor device according to the present invention may also have a configuration, in which the semiconductor device comprises the plurality of electrically conducting plugs having substantially different cross sectional areas in the horizontal plane of the semiconductor substrate. Since the electrically conducting plug having a desired cross-sectional geometry or a desired cross sectional area can be provided in the insulating film according to the present invention, a degree of flexibility in designing the apparatus configuration can be improved.

The semiconductor device according to the present invention may have a configuration, in which the plurality of through holes are provided in a single piece of the semiconductor substrate, and wherein cross-sectional geometries of the plurality of through hole in the horizontal plane of the semiconductor substrate are substantially identical. Having such configuration, the configuration of a through hole can be standardized, thereby providing the configuration promoting further improved manufacturing stability.

The method according no the present invention may have a configuration, in which the insulating film is composed of a photosensitive material, and wherein the providing the plurality of second holes includes selectively irradiating ultraviolet to a predetermined region of the photosensitive material. Having such configuration, the second hole can be more stably provided in the insulating film with a simple process.

The method according to the present invention may have a configuration, which further comprises forming a second electrically conducting film along the inside wall of the first hole before the providing the insulating film, wherein the forming the first electrically conducting film includes exposing the second electrically conducting film on the bottom by conducting an anisotropic etching to selectively remove the insulating film on the bottom of the first hole, and growing the first electrically conducting film from the second electrically conducting film exposed on the bottom by a plating process. Having such configuration, a generation of a void in the first electrically conducting film can be inhibited.

Further, in these aspects according to the present invention, a configuration including the aforementioned plurality of electrically conducting plugs having cross-sectional geometries from the upper viewpoint of substantial polygon such as substantial square, octagons and the like or substantial, circle may be employed.

Further, in these aspects according to the present invention, the electrically conducting plug is formed to fill the electrically conducting film, contacting with the inside wall of the hole provided in the insulating film. Having such configuration, a configuration that is capable of providing an ensured insulation of the side surface of the electrically conducting plug in the simple manufacturing process.

Further, in the method according to the present invention, the reducing a thickness of the semiconductor substrate may include reducing the thickness of the other surface thereof via grinding, polishing or etching processes. Further, the aforementioned exposing the first electrically conducting film may include exposing the aforementioned first electrically conducting film by processing the aforementioned other surface via a polishing, a chemical mechanical polishing (CMP) or an etching.

Further, in these aspects according to the present invention, the aforementioned plurality of electrically conducting plugs may extend through the aforementioned insulating film and may be mutually isolated by the aforementioned insulating film.

Further, in these aspects according to the present invention, a configuration, in which the insulating films buried in one of the aforementioned through hole are deposited in same process, may be employed.

Preferable embodiments according to the present invention will be described as follows in further detail, in reference to the annexed figures. In all figures, identical numeral is assigned to an element commonly appeared in the figures, and the detailed description thereof will not be presented.

First Embodiment

The present embodiment relates to a semiconductor device that includes a through electrode. FIG. 1 is a diagram, schematically showing a configuration of a semiconductor device according to the present embodiment. FIG. 2 is an cross-sectional view of FIG. 1 along A-A'. The semiconductor device 100 shown in FIG. 1 and FIG. 2 includes a silicon substrate 101, a through hole 103 of having a rectangular cross section extending through the silicon substrate 101, and a through electrode structure 102 that is buried in the through hole 103 and extends through the silicon substrate 101. The through electrode structure 102 includes an insulating film 105 filled in the through hole 103 and a plurality of columnar through plugs 107, each of which is buried in each of a plurality of holes provided in the insulating film 105.

FIG. 1 illustrates a configuration, in which four through plugs 107 having same cross-sectional geometry of square and same, cross sectional, area are buried, in the insulating film 105. A plurality of through plug 107 are disposed in a tetragonal lattice pattern in a horizontal plane of the silicon substrate 101. Each of the through plugs 107 is composed of the electrically conducting film that, is filled so as to contact with a hole provided in the insulating film 105. Further, all through plugs 107 are buried in the insulating film 105 in a condition that the entire side surfaces are in contact with the insulating film 105.

In the semiconductor device 100, the thickness of the silicon substrate 101 is, for example, 50 µm. In addition, the width of the through hole 103 in the horizontal plane of the silicon substrate 101, i.e., the length of one side of the square in this case, is, for example, 50 µm. Further, the width of the through plug 107 in 3 the horizontal plane of the silicon substrate 101, that is, the length of one side of the square in this case, is, for example, 10 µm. Moreover, a material of the insulating film 105 filled in the through hole 103 is, for example, inorganic spin on glass (SOG) film formed of $SiO_2$.

In addition, the through plug 107 buried in the insulating film 105 is a through electrode extending through the insulating film 105. The through plug 107 is composed of an electric conductor. Materials for the through plug 107 may be, for example, metals such as Cu, Au, W, Al, Ni and the like, a metal silicide or a polysilicon. A conductive member such as a bump or an interconnect may be connected to the upper or the lower surface of the through plug 107 as discussed later, though it is not shown in FIG. 1 or FIG. 2.

While the configuration of providing one through hole 103 on the silicon substrate 101 is illustrated in FIG. 1 and FIG. 2, number and arrangement of the through hole 103 are not particularly limited, and may be suitably selected depending on the design of the semiconductor device 100. While the configuration, in which the geometry of through hole 103 is a square that is one of a geometry having a corner in the horizontal plane of the silicon substrate 101, is illustrated in FIG. 1, the through hole 103 may have a substantially rectangular geometry that has no corner. In addition, the through plug 107 buried in the insulating film 105 may have a rectangular geometry that has no corner from the upper viewpoint.

Next, the process for manufacturing the semiconductor device 100 will be described. Concerning the semiconductor device 100, in one surface of the semiconductor substrate, a via (aperture), which is not extended to the surface, is formed, and the via is filled with an insulating film, and then, a plurality of vias for plug are provided in the insulating film, from one surface thereof, and the interiors of the vias are filled with an electrically conducting film. Thereafter, the semiconductor substrate is retracted from the other surface, and the thickness thereof is reduced to expose the electrically conducting film, thereby obtaining the device.

Figure 3A:
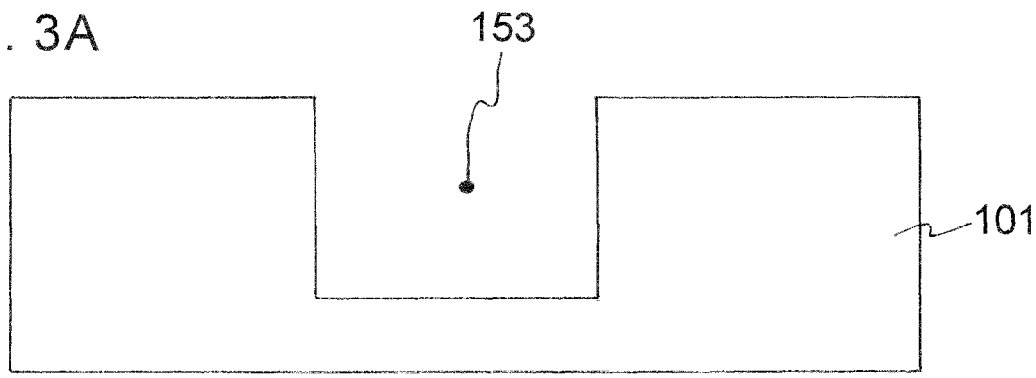
FIGS. 3A to 3C are cross-sectional views of the semiconductor device, schematically illustrating a process for manufacturing the semiconductor device according to an embodiment of the present invention.

FIG. 3A to FIG. 3C, FIG. 4A and FIG. 4E are cross-sectional views, schematically illustrating a process for manufacturing the semiconductor device 100. First, a patterned mask is formed on the surface of the silicon substrate 101 employing a photolithographic technology, so as to provide an opening at a position for providing the through hole 103. Then, exposed regions of the silicon substrate 101 outside the patterned mask are etched to form a concave portion 153 (FIG. 3A). A cross-sectional geometry of the concave portion 153 may be, for example, rectangle such as square shown with FIG. 1 or substantially rectangular geometry. Here, the concave portion 153 may be tapered so as to decrease the opening width from the surface of the silicon substrate 101 toward the inside thereof. Having such configuration, the filling of an electrically conducting film 113 described later can be further ensured.

Figure 3B:
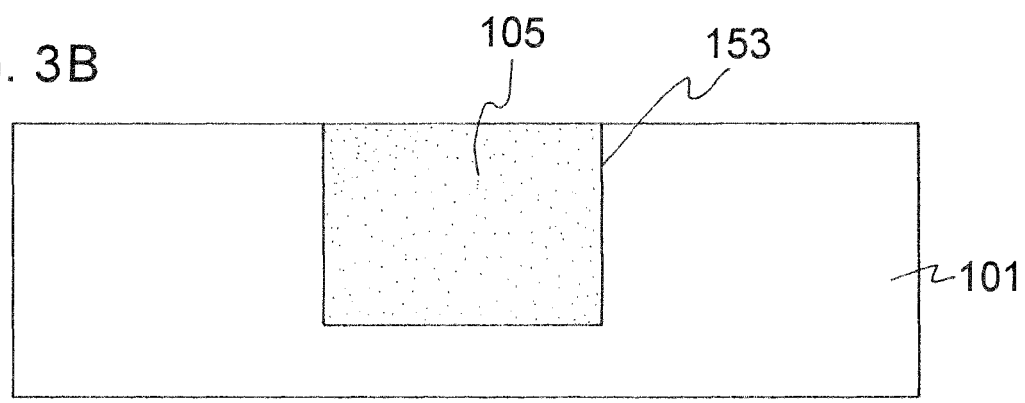

Next, an insulating film 105 having lower dielectric constant than silicon is deposited on the formation surface of the concave portion 153 in the silicon substrate 101 to fill the concave portion 153 with the solid insulating film 105. For example, when an inorganic SOG film is employed for the insulating film 105, a $SiO_2$ film is deposited to a thickness of, for example, about 10 µm by a SOG coater. Then, the insulating film 105 on the silicon substrate 101 is removed by a chemical mechanical polishing (CMP) to expose the surface of the silicon substrate 101 (FIG. 3B).

Figure 3C:
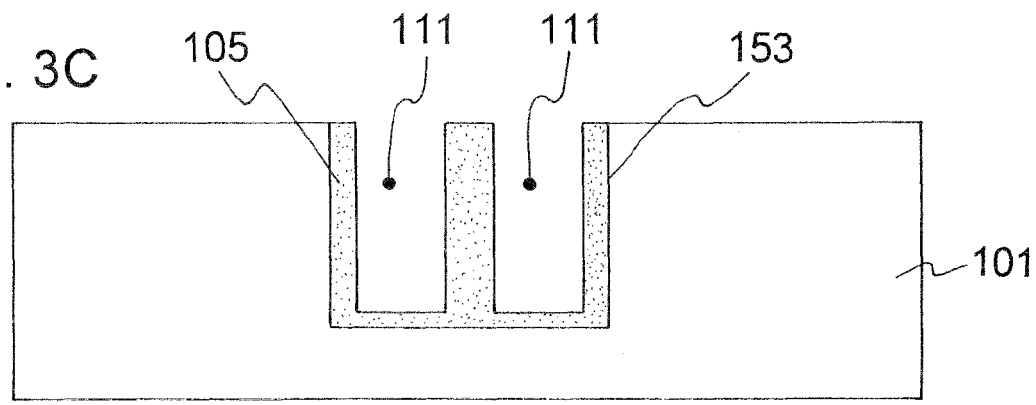

Subsequently, a mask (not shown) is patterned on the surface of the silicon substrate 101 using a photolithographic technology. Then, regions for providing the through plugs 107 in the insulating film 105 are selectively removed by an anisotropic etching through the mask to form, a plurality of concave portions 111 in the insulating film 105 (FIG. 3C).

Figure 4A:
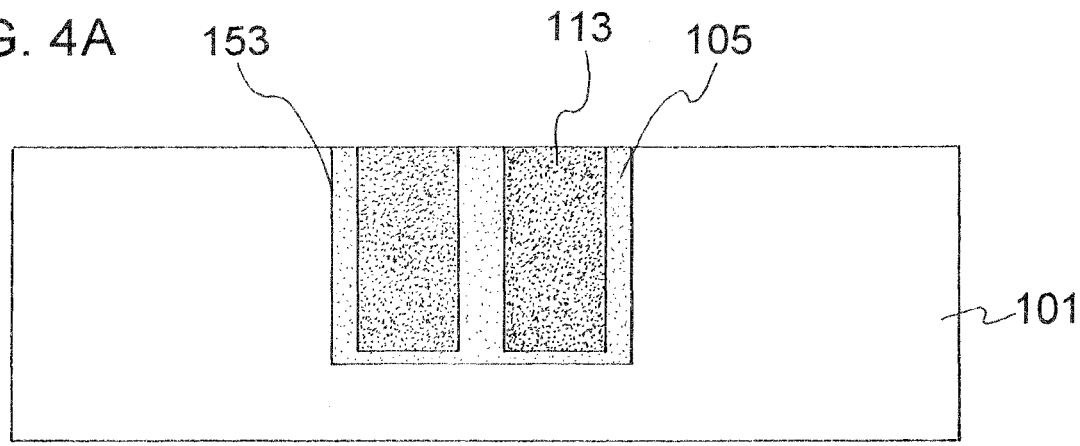
FIGS. 4A and 4B are cross-sectional views of the semiconductor device, schematically illustrating a process for manufacturing the semiconductor device according to an embodiment of the present invention.

Then, the electrically conducting film 113 is provided on the surface of the silicon substrate 101 to fill the concave portion 111. For example, when the electrically conducting film 113 is a Cu film, a seed Cu film (not shown) is first deposited on the entire surface of the silicon substrate 101. Thereafter, Cu film is deposited as the electrically conducting film 113 for forming the through plug 107 by, for example, an electrolytic plating process. Here, a metallic film such as tungsten (W) film or a polysilicon film can be filled therein as the electrically conducting film 113 by CVD process. In addition, a metallic film such as Ni film may also be filled as the electrically conducting film 113. Next, the electrically conducting film 113 on silicon substrate 101 is removed by CMP or etchback process. This provides a geometry the electrically conducting film 113 that are divided into four through plugs 107 (FIG. 4A).

In this case, though it is not shown in FIG. 1 and FIG. 2, an integrated circuit including certain interconnects and elements may be formed by employing, for example, a damascene process, after the above described CMP or the etchback process for the electrically conducting film 113. The interconnect layer in integrated circuit may be a monolayer or multiple layers.

Figure 4B:
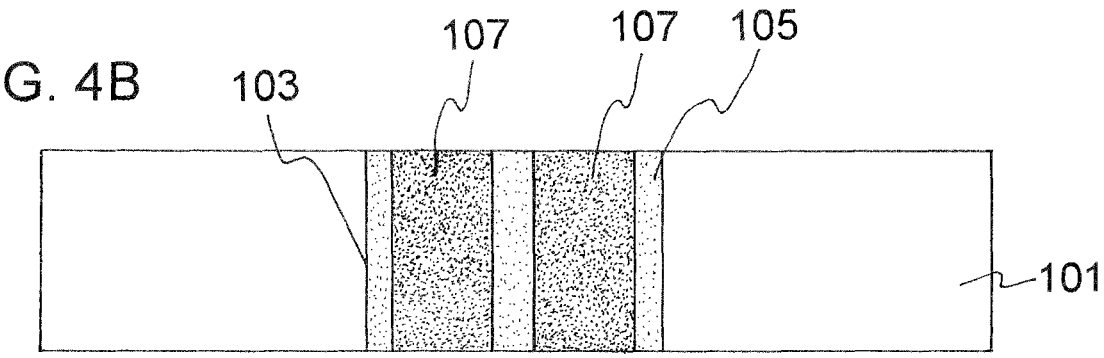

Next, the polishing surface side thereof is fixed to a support (not shown), and a process for reducing the thickness of the silicon substrate 101 is conducted (FIG. 4B). As for the process for reducing the thickness, a grinding process, a polishing process or an etching process may be employed. For example, a back surface-grinding may be conducted by a mechanical polishing. The thickness of the thinned silicon substrate 101 is appropriately selected depending on the device configuration of the semiconductor device 100, and may be, for example, 50 μm. In addition, the thickness of the silicon substrate 101 may be on the order of 20 to 400 μm, when the semiconductor device 100 is a silicon interposer. Thereafter, the support are stripped off from the silicon substrate 101 to obtain the semiconductor device 100 shown in FIG. 1.

While the case of exposing the electrically conducting film by processing from the back surface side of the silicon substrate 101 has been described above as a typical case, the procedure for reducing the thickness of the silicon substrate 101 and the procedure for exposing the electrically conducting film 113 may not be conducted in one process, and may be conducted in separate processes.

For example, after the structural member shown with FIG. 4A is manufactured, the back surface-grinding of the silicon substrate 101 is conducted by a mechanical polishing. In this case, the thickness of the silicon substrate 101 is reduced to a level so as not to expose the electrically conducting film 113. Then, for example, the back surface of the silicon substrate 101 is further retracted to expose the electrically conducting film 113 by a wet etching process employing a liquid mixture of hydrofluoric acid and nitric acid (fluoro-nitric acid) or by a dry etching. Subsequently, the insulating film 105 covering the surface of the electrically conducting film 113 is removed by, for example, CMP or dry etching. As such, the through plug 107 is formed.

Having this configuration, when a metallic film is employed for the electrically conducting film 113, scattering of waste metal generated in the grinding thereof, generation of a crack in the insulating film 105 or a short circuits accompanied thereof can be inhibited. Therefore, a damage to the through plug caused by the machine grinding can be inhibited to provide more stable formation of the through plug 107.

Next, the advantageous effect obtainable by employing the semiconductor device shown in FIG. 1 will be described as follows. In the semiconductor device 100 in FIG. 1, a plurality of mutually insulated through plugs 107 having substantially same geometry are buried within one insulating film 105. As described above in reference to Japanese Patent Laid-Open No. 2003-7,909, one interconnect basically corresponds to one through hole 103 formed in the silicon substrate 101 in the conventional technology. Therefore, the same number of the through holes as the through electrodes are required, in order to obtain a plurality of through electrodes. On the contrary, in the present embodiment, a larger quantity of signal transmission can be conducted by disposing a plurality of through plugs 107 in one through hole 103. Therefore, a larger quantity of signal transmission can be conducted by employing a smaller number of through holes 103, and therefore the number of the through hole 103 formed in the silicon substrate 101 can be reduced.

In addition, the through plugs 107 that are the through electrode extending through the silicon substrate 101 can be provided with higher density by forming a plurality of through plugs 107 in one via, namely in one through hole 103. In addition, a reduced interval between the through plugs 107 can be provided. Therefore, the through electrode structure 102 can be formed within a smaller area. Thus, area of the region required for forming the through electrode structure 102 in the horizontal plane of the silicon substrate 101 can be reduced.

Since the conventional apparatus described above in reference to Japanese Patent Laid-Open No. 2003-7,909 has a configuration of providing one through electrode in one through hole, an enhancement in density of the arranged through holes is required for increasing the density of the through electrodes. However, when a plurality of through holes are formed on one piece of the silicon substrate, a given interval between two adjacent through holes is required according to the manufacturing process and/or reliability of the apparatus. A certain interval provided on the silicon substrate leads to dead, spaces that are difficult to be utilized are generated on the silicon substrate, and thus there is a case that the density of the through electrode can not be improved.

On the contrary, according to the semiconductor device 100 shown in FIG. 1 and FIG. 2, the degree of integration of the through plugs 107 can be improved and a required number of the through holes 103 can be reduced. Further, the dead spaces on the silicon substrate 101 can be reduced by applying the semiconductor device 100 to a stack-type multiple-chip module.

In addition, in case of the conventional configuration, having a ring-like dual chip through plug in the manner described in Japanese Patent Laid-Open No. 2002-43,502, two electrically conducting plugs are available to be formed in one through hole, and a number of through plugs 107 are not disposed in one through hole 103, unlike the present embodiment. In addition, since the device disclosed in the Japanese Patent Laid-Open No. 2002-43,502 has a cylindrical chip through plug having an annular circular cross section, the diameter of the outer cylinder is larger than the diameter of the inner cylinder, and therefore the chip through plugs should be arranged toward the outside of the substrate in order to form the chip through plugs in one through hole. Therefore, it is difficult to provide an enhanced degree of integration of the chip through plugs. In addition, the cylindrical chip through plug provides larger area of the region for forming the chip through plug than the columnar member having the same cross sectional area. According to these reasons, it is difficult to provide the through plugs in one through hole at higher density in the configuration described in Japanese Patent Laid-Open No. 2002-43,502.

On the contrary, since a plurality of solid through plugs 107 having substantially the same geometry are arranged in a tetragonal lattice pattern in the horizontal plane of the silicon substrate 101 of the semiconductor device 100 shown in FIG. 1 and FIG. 2, the through plugs 107 can be provided with a higher degree of integration in the insulating film 105 buried in the through hole 103. Therefore, number of the through holes 103 can be reduced.

In addition, the semiconductor device 100 has the configuration that promotes a standardization of the dimension or the arrangement of the through holes 103 for being plugged with the insulating film 105. A deterioration in the reliability of the through plug 107 due to a thermal stress or a process stress can be prevented by standardizing the dimension or arrangement of the through hole 103. In addition, reliability tests for the through plug 107 by categories are not necessarily conducted, and thus the semiconductor device 100 having the through plugs 107 can be stably supplied. In addition, a degree of flexibility in the selection of number of through plugs 107 is increased in designing the through electrode structure 102, thereby facilitating the design.

In addition, since a plurality of through plugs 107 are buried in one insulation film 105, the signal interconnect can be disposed in the same one through hole 103 with a power source and a ground (GND) interconnect. Thus, the power source can be supplied with a short interconnection length. Therefore, an IR drop (voltage drop in the power line) can be prevented.

Further, the connection of a plurality of through plugs 107 buried in the insulation film 105 to one interconnect can be achieved, if one interconnect layer is provided, on the silicon substrate 101. Thus, an interconnect configuration having smaller-resistance and capacity can be obtained without the need, for having an extended buried width of the through plug 107. Further, the configuration, in which a plurality of through plugs 107 are joined with one interconnect, can be presented. Having such configuration, the junction reliability can be improved by power of times, as compared with the case of joining an interconnect with one through plug 107. In addition, a plurality of through plugs 107 are provided in one through hole 103 and these are connected to one signal line, so that the filling capability in the through plus 107 can be improved and a substantially wide and thick interconnect can be obtained.

In addition, in the semiconductor device 100, since a plurality of through plugs 107 are buried in the through hole 103, this presents a configuration of providing a relatively increases diameter of the through hole 103. Therefore, as apertures are selectively formed in the silicon substrate 101 via a dry etching process, a decrease in the etch rate due to a micro loading effect, which is concerned to be occurred in the case of having a narrower and deeper through hole 103, can be inhibited. According to such configuration, a decrease in the throughput during the dry etching-process can be inhibited, thereby providing an improved productive efficiency for the semiconductor device 100.

While the configuration of the through plug 107 having the rectangular cross-section is illustrated for the semiconductor device 100, the cross-sectional shape of the through plug 107 is not particularly limited to the rectangular shape provided that it is a column-shaped in the present embodiment and other embodiments described as follows. For example, the cross-section of the through plug 107 may be circle, oval, polygon or the like. While the embodiment having a plurality of through plugs 107 arranged in the tetragonal lattice pattern in the horizontal plane of the silicon substrate 101 is illustrated for the semiconductor device 100, the arrangement of the through plugs 107 may be an arrangement of a diagonal lattice pattern such as a staggered lattice pattern.

Figure 5:
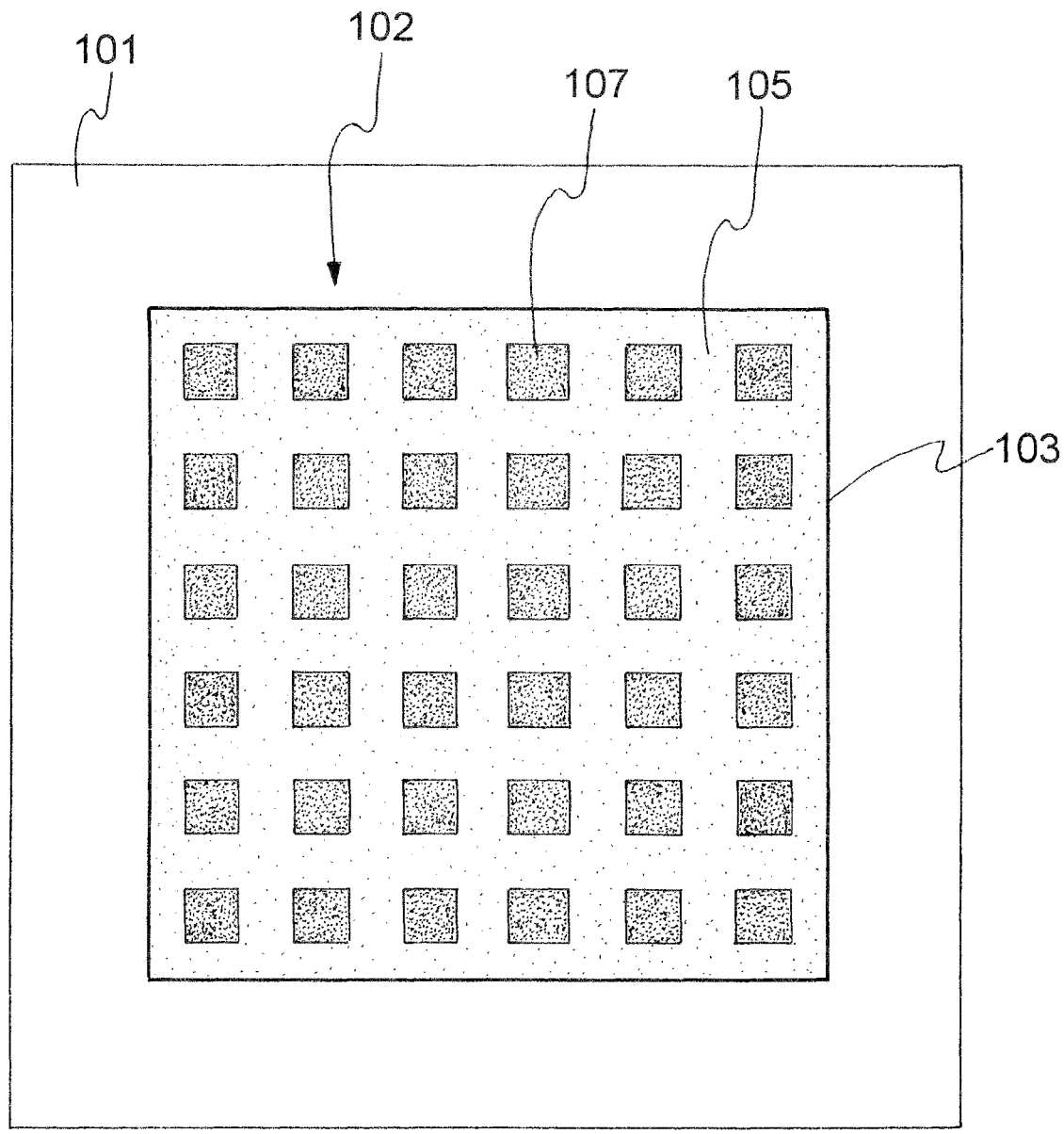
FIG. 5 is a plan view, schematically showing a configuration of a semiconductor device according to an embodiment of the present invention.

Further, while a configuration having, four through plugs 107 provided in one through hole 103 is illustrated in FIG. 1, number of the through plugs 107 per one through hole 103 is not particularly limited if it is any plural number, and may be suitably selected according to the design of the device. FIG. 5 is a plan view, illustrating a semiconductor device having a configuration providing 36 through plugs 107 in one through hole 103. A width of one through plug 107 as seen from a direction normal to the silicon substrate 101 may be, for example, about 3 μm, and a width of the through hole 103 may be, for example, 30 μm. As shown in FIG. 5, the through plugs 107 can be provided with higher degree of integration within the region of smaller area, by increasing number of the through plugs 107 per one through hole 103.

Since a plurality of through plugs 107 are buried in one through hole 103 as through electrodes in the semiconductor device 100 shown in FIG. 1 and FIG. 2, this can be preferably utilized as, for example, a silicon interposer, which is provided and couples between a logic large scale integrated circuit (LSI) chip including a logic circuit formed therein and a memory chip including a memory element such as dynamic random, access memory (DRAM) provided therein. Since an electrical conduction through the logic LSI chip and the DRAM chip can be achieved via the through electrode of the interposer in such stacked semiconductor device, advantageous effects such as an improvement in the processing rate and a reduction in the power consumption can be obtained, as compared with a case of providing a conduction therebetween via a wire bonding.

Moreover, the semiconductor device 100 may be a memory chip provided with a memory element such as DRAM. In the case of a memory chip including larger number of external terminals, an electrical connection through the external terminal can also be definitely ensured by having the configuration shown in FIG. 1 and FIG. 2. Further, the semiconductor device 100 may be a logic chip including a logic element layer having transistors formed therein.

Further the insulating film 105 in the present embodiment may be, for example, a low dielectric constant film having a dielectric constant of equal to or lower than 3.5, or an organic compound insulator film such as a polyimide film.

Further, in semiconductor device 110, the through plugs can be formed from the side of the back surface opposite to the surface of silicon substrate 101 on which the element is formed. In this case, for example, a concave portions 153 are provided after reducing the thickness of the silicon substrate 101, and after the through plugs 107 are formed via the process stated above in advance, predetermined semiconductor elements may be formed on the surface that the elements are to be formed. This allows forming the through plugs 107 from the back surface thereof.

In a following embodiment, different points from first embodiment will be mainly described.

Second Embodiment

Figure 6:
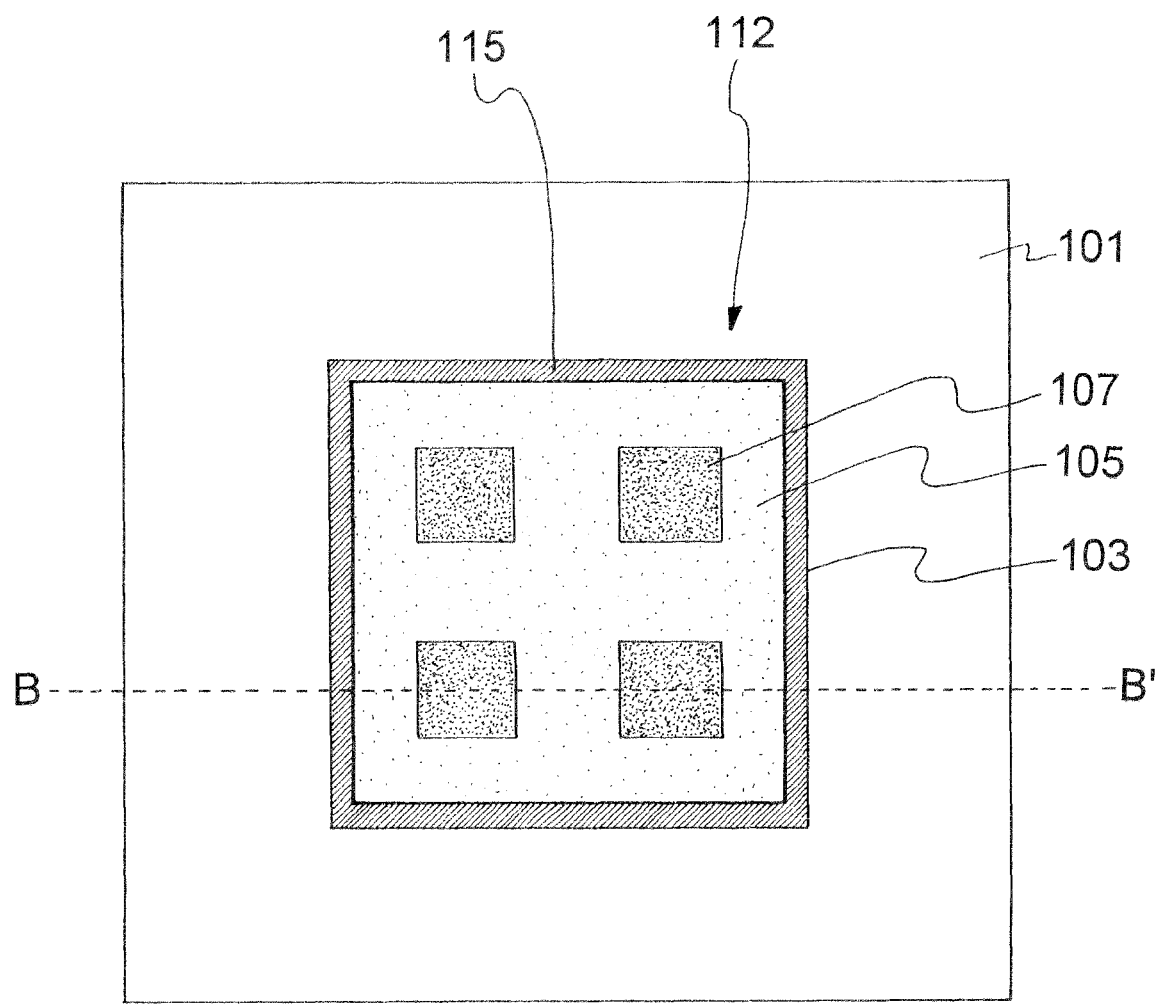
FIG. 6 is a plan view, schematically showing a configuration of a semiconductor device according to an embodiment of the present invention.
Figure 7:
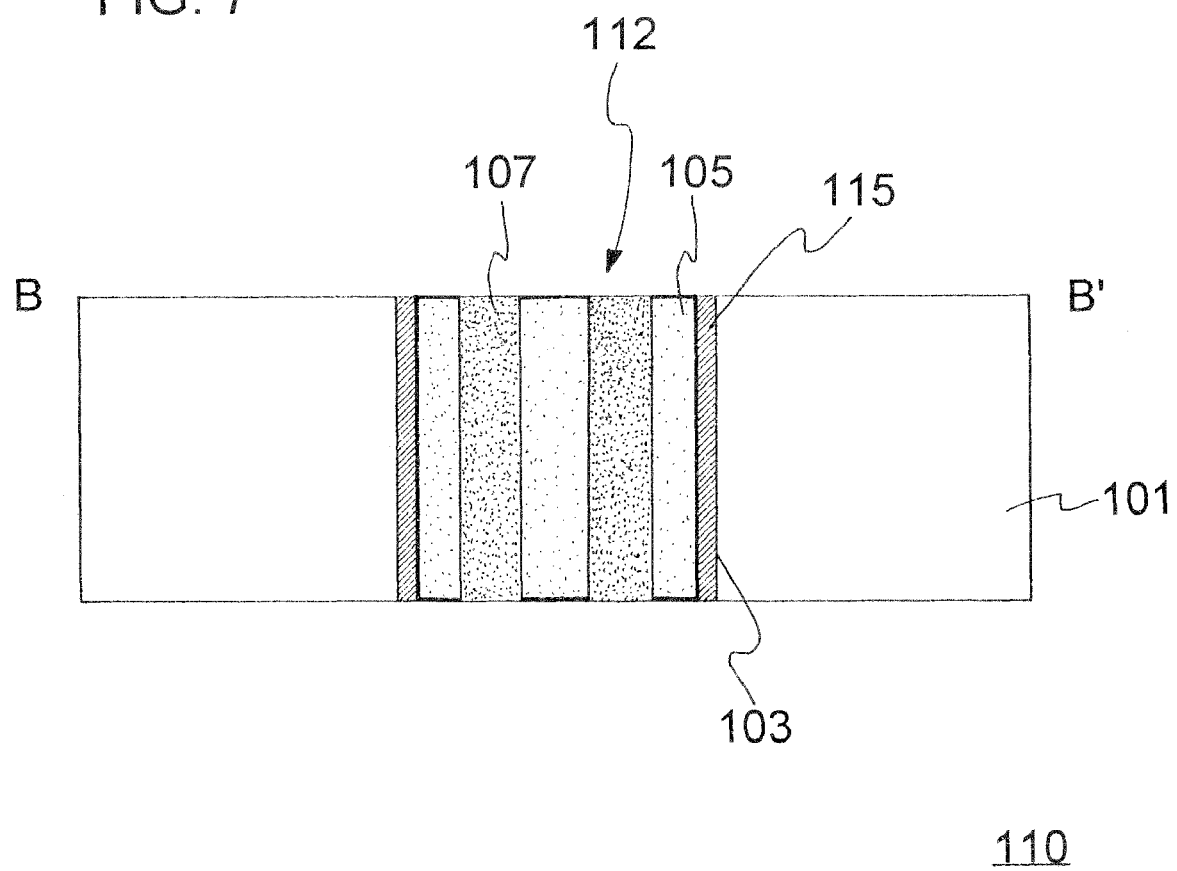
FIG. 7 is an cross-sectional view of FIG. 2 along B-B'.

FIG. 6 is a plan view, schematically showing a configuration of a semiconductor device according to the present embodiment. A semiconductor device 110 shown in FIG. 6 includes a silicon substrate 101 and a through electrode structure 112. A basic configuration of the through electrode structure 112 is almost similar to the through electrode structure 102 provided in the semiconductor device 100 (FIG. 1) as described in first embodiment, except that a metallic seed layer 115 is provided between the insulating film 105 and the silicon substrate 101. Material for the seed layer 115 may be a metallic material similar to that for the through plug 107, or a metallic material, which is capable of being a nucleus for a metallic plating of through plug 107 and of providing the nuclear growth thereafter. FIG. 7 is an cross-sectional view of FIG. 6 along B-B'.

Next, the process for manufacturing the semiconductor device 110 shown in FIG. 6 and FIG. 7 will be described. FIG. 8A to FIG. 8C and FIG. 9A and FIG. 9B are cross-sectional views of the semiconductor device, schematically showing a procedure for manufacturing the semiconductor device 110 according to the embodiment.

Figure 8A:
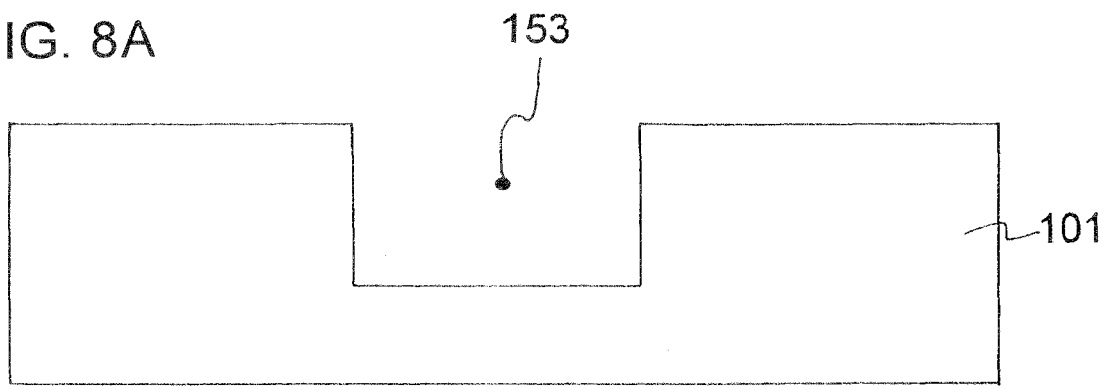
FIGS. 8A to 8C are cross-sectional views of the semiconductor device, schematically illustrating a process for manufacturing the semiconductor device according to an embodiment of the present invention.
Figure 8B:
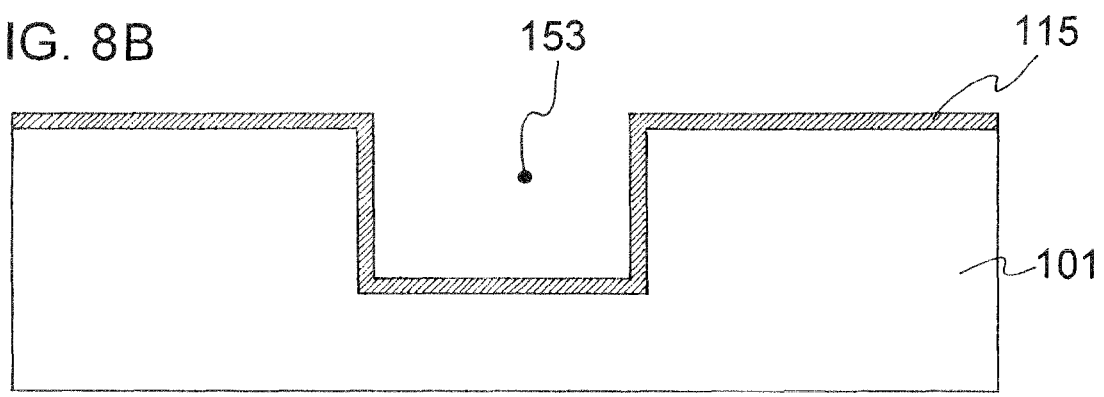
Figure 8C:
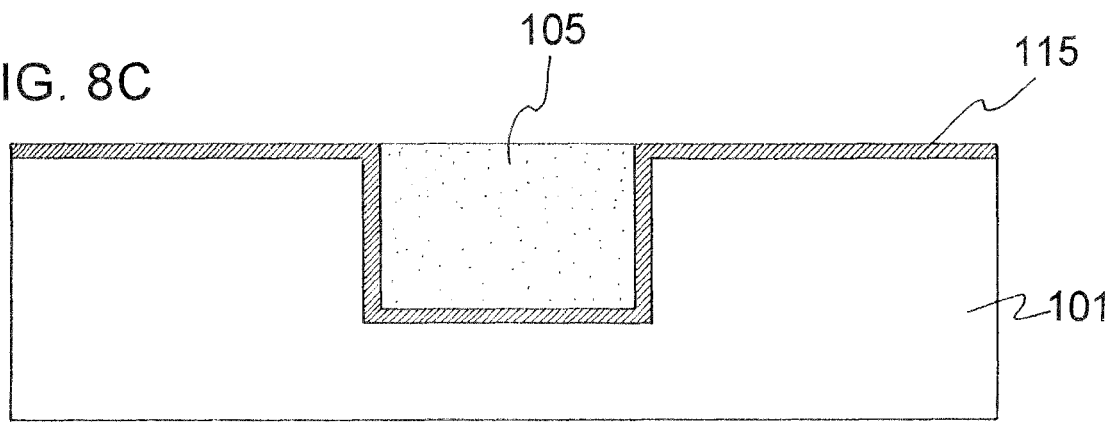

First, a concave portion 155 is formed on the silicon substrate 101 with the process described above in reference to FIG. 3A (FIG. 8A). Next, a seed layer 115 is provided, for example, by sputtering, on the entire surface of the silicon substrate 101 provided with the concave portion 153 (FIG. 8B). Material for the seed layer 115 is selected to be the same as that for the through plug 107, and more specifically Cu, for example.

Figure 9A:
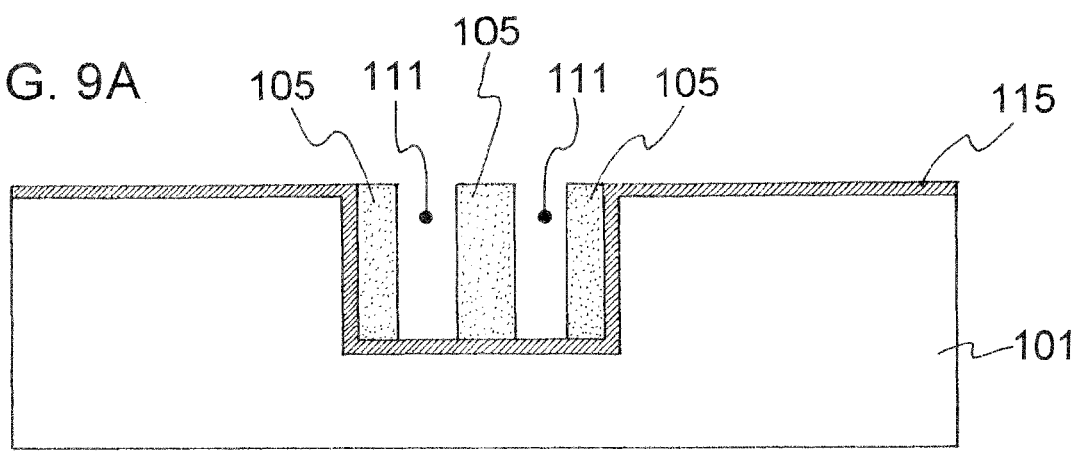
FIGS. 9A and 9B are cross-sectional views of the semiconductor device, schematically illustrating a process for manufacturing the semiconductor device according to an embodiment of the present invention.
Figure 9B:
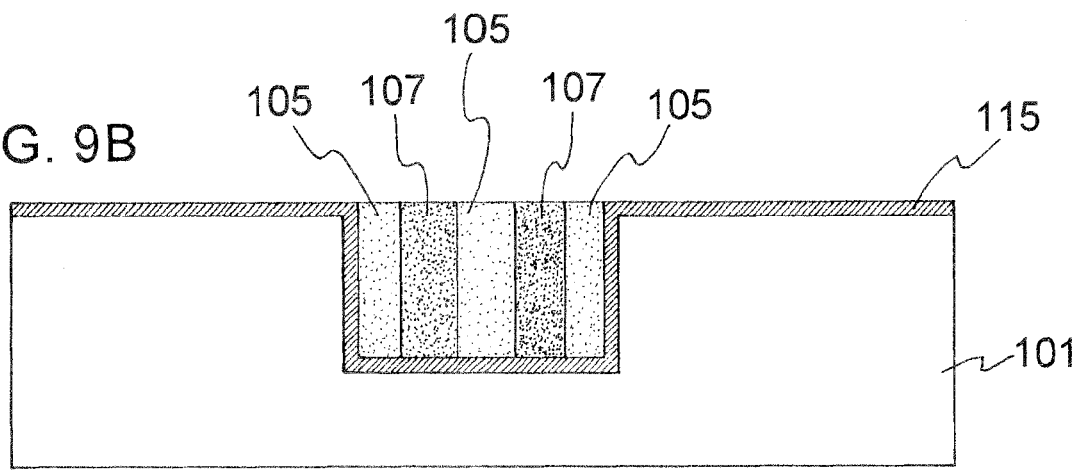

Then, processes described in reference to FIG. 3B and FIG. 3C are conducted to deposit the first insulating films 105 (FIG. 8C), and then the concave portions 111 are provided at predetermined locations of the insulating film 105. Next, the insulating film 105 that covers the bottom, surfaces of the concave portions 111 is selectively removed, by conducting an anisotropic etching to expose the seed layer 115 on the bottom surfaces of the concave portions 111 (FIG. 9A). Then, the seed layer 115 exposed, on the bottom surfaces of concave portions 111 is utilized as a nucleus, and a metallic film that will be the through plugs 107, is deposited on the bottom surface thereof via a plating process (FIG. 9B).

Then, the silicon substrate 101 is ground from the back surface to reduce the thickness thereof, and the seed layer 115 provided on the bottom surface of concave portion 153 is removed to expose the through plugs 107. As such, the semiconductor device 110 shown in FIG. 6 and FIG. 7 is obtained.

Next, the advantageous effect obtainable by employing the semiconductor device 110 shown in FIG. 6 and FIG. 7 will be described as follows.

Since a plurality of through plugs 107 are also buried in one insulating film 105 in the semiconductor device 110, advantageous effects similar to that obtainable in first embodiment can also be obtained.

Further, the semiconductor device 110 shown, in FIG. 6 and FIG. 7 has the configuration, in which the metallic film for forming the through plugs 107 can be grown via the plating process from the bottom of the concave portion 111 according to a bottom-up process. Since the through, plugs 107 are grown according to the bottom-up process, generation of voids in the through plugs 107 can be prevented. Thus, the semiconductor device 110 having the through electrode structure 112 provided with a plurality of through plugs 107 in one through hole 103 can be stably manufactured, at higher production yield.

Further, in this manufacturing process, the plating phenomenon proceeds toward one direction from the lower portion to the top portion. Thus, uniform filling can be achieved, regardless of the diameter of the concave portion 111. Further, since the plating phenomenon according to the embodiment proceeds only in the interior of the concave portion 111 unlikely in the ordinary plating for entire surface, CMP process for removing the electrically conducting film covering the surface of the silicon substrate 101 is not required. Therefore, it is possible to provide the simplification of the manufacturing process and the reduction of the manufacturing cost.

In the process for manufacturing the semiconductor device 110, an electrolytic plating process may be employed for a plating process that may be utilized in a case of depositing the through plugs 107 in the concave portion 111 (FIG. 9B). In this case, since only the patterned section is plated and void is not generated as compared with the plating for entire surface, the current density or the duty ratio, or in ether words, the ratio of the weld-time in the total plating time, can be increased. Therefore, while duty ratio is, for example, equal to or less than 5% when the through electrode is formed by the conventional plating for the entire surface, the manufacturing method according to the present embodiment can avoid non-weld time, and therefore the filling time can be dramatically reduced. Moreover, the formation of the metallic film in the unwanted portions having no pattern can be inhibited.

Further, in the process for manufacturing the semiconductor device 110, an electroless plating may be employed as the plating method utilized for depositing the through plugs 107. In such case, the plating process can be carried out by a batch process. Therefore an improved throughput for the process for forming the electrically conducting film can be achieved. In addition, the electrically conducting film for forming the through plug 107 can be deposited within the concave portion 111 with lower cost.

As such, the throughput in the process for depositing the electrically conducting film that will be the through plugs 107 can be dramatically improved by manufacturing the semiconductor device 110 of the present embodiment employing the process shown in FIG. 8A to FIG. 8C, FIG. 9A and FIG. 9B.

In addition, the seed layer 115 surrounding the circumference of the through plugs 107 is formed in the semiconductor device 110. Therefore, the configuration of providing a shield in the outside of a number of through plugs 107 surrounding thereof can be achieved. Having this configuration, power supply or a grounding (GND) line can be disposed in the periphery of the signal electrode to provide an electrical shielding thereof. Since a source of noise can be surrounded with the electric conductor having a constant potential according to such configuration, any radiation reached from the through electrode can be reduced, thereby providing a reduced electro magnetic interference (EMI) or crosstalk noise.

Thus, the imposition for the noise reduction design can be reduced, so that the configuration can be preferably employed for the application of the multiple-chip modules. Under a circumstance where a reduction of noise is particularly required due to a requirement for miniaturizing the intervals between the through electrodes in recent years, further reductions in the crosstalk noise or the EMI can be further achieved by having the configuration of the present embodiment, since an interconnect having a constant potential can be disposed adjacent thereof via only the insulating film 105 without silicon.

Third Embodiment

In the present embodiment, a photosensitive material is employed for the material of the insulating film 105 in the semiconductor device described in the above-mentioned embodiment. The semiconductor device 100 described in first embodiment will also be exemplified in this embodiment, as follows.

Available materials for the insulating film 105 may include photosensitive materials exhibiting an electrical insulation, such as photosensitive glasses, or photopolymers such as photosensitivity polyimide and the like. The photosensitive material may be a positive type, or a negative type. When the insulating film 105 composed of a positive type photosensitive material is employed, the semiconductor device 100 is manufactured in the following procedure.

First, a concave portion 153 is formed in the silicon substrate 101 by employing the process described above in reference to FIG. 3A. Then, a photosensitive material such as, for example, a film of photosensitivity polyimide, is applied via a spin coating process so as to fill the concave portion 153 therewith (FIG. 33).

Next, regions for providing the through plugs 107 of the photosensitivity polyimide film are selectively removed by employing a photolithographic technology to provide concave portions 111. In this case, predetermined regions of the photosensitivity polyimide film are irradiated with ultraviolet radiation (that is, exposure), and then a developing process is carried our by using a liquid developer. The unwanted polyimide film remaining on regions for forming the concave portions 111 and the surface of the silicon substrate 101 are removed (FIG. 3C).

Then, a process for filling the electrically conducting film 113 and a process for reducing the thickness of the silicon substrate 101 are conducted, by employing the process as described above in reference to FIG. 4A and FIG. 4B. As described above, the semiconductor device according to the present embodiment is obtained.

According to the present embodiment, the following advantageous effects are obtained, in addition to the advantageous effect obtained in the above-described embodiments. Since the material of the insulating film 105 is the photosensitive material in the present embodiment, the process for opening the concave portions 111 in the insulating film 105 can be achieved by conducting only a photolithography process and a subsequent wet etching process. Therefore, processes for forming the mask and removing and cleaning thereof can be omitted, as compared with a process that requires a single-wafer process requiring a mask, such as a dry etching process. Therefore, a simplification of the manufacturing process can be achieved. In addition, since the developing process can be conducted via a batch processing, the throughput can also be enhanced.

Here, in the present embodiment, a film of a photosensitive glass can also be deposited for utilizing as the insulating film 105, by applying a photosensitive glass paste on the silicon substrate 101. The photosensitive glass paste may contain, for example, a glass powder, a photosensitive compound and a predetermined organic solvent. Further, the photosensitive glass paste may include a photosensitizer.

The glass powder contains, for example, $SiO_2$, $B_2O_3$ and the like as a main component. Further, for example, PbO, $Al_2O_3$, $Bi_2O_3$, ZnO, CaO, $Li_2O$, $TiO_2$, $ZrO_2$ or the like may be added to the glass powder. In addition, these glass powders may be employed alone, or two or more of these may be jointly employed.

In addition, the photosensitive compound may contain at least one of, for example, Au, Ag, $Cu_2O$ or $CeO_2$, and may be preferable to contain two or more of these elements/compounds.

In addition, a mixture of the following (i) and (ii) may also be employed as the photosensitive compound:

(i) a chemical compound having alkoxy group, such as polymethoxy siloxane (brand name: "MKC silicate MS-57" commercially available from Mitsubishi Chemical Co., Ltd.), zirconium tetra n-butoxide, trimethyl borate and the like; and (ii) a chemical compound, having molecular backbone represented by the following general formula (1), such as bis(2, 4,6-trimethyl benzoyl)phenyl phosphine oxide (brand name: IRGACURE 819, commercially available from Ciba Specialty Chemicals), benzoic anhydride and the like.

(1)

(where, in the above-described general formula (1), Y represents atom of IVB group, VB group or VIB group of periodic table; n, appeared as (n) in the upper right of atom Y, represents number of bond of atom Y; Z represents hydrogen atom, hydrocarbon group, hydroxyl group, mercapto group, amino group, halogen group, alkoxyl group, alkylthio group, carbonyl oxy group or oxo group; and n appeared as n−2 in the lower-right of Z represents an integer number of 2-5, provided, however, that, in case of n is 4 and Z is oxo group, number of Z is 1, and in case of n is 5 and Z is oxo group, number of Z excluding oxo group is 1).

In addition, when a photosensitive glass is employed for the material of the insulating film 105, as for the photosensitive glass paste employed in the deposition process for the insulating film 105, a photosensitive glass paste, combined with, for example, an inorganic component and a photosensitivity vehicle (photosensitive organic constituent) with a weight ratio of 40:60 to 70:30 may also be employed. Here, combined ratio of the inorganic component may be preferable to be 50:50 to 55:45. More specifically, as for the photosensitive glass paste, a compound formed by dispersing an inorganic component powder and a photosensitive vehicle (photosensitive organic constituent) by using tri-roll mill apparatus may also be employed. A powder of glass having higher melting point such as a mixture powder of for example, $SiO_2$—$B_2O_3$—$K_2O$ glass and $SiO_2$—$B_2O_3$—$Al_2O_3$ glass can be included as an inorganic component. Ceramic particles such as a dielectric ceramic such as $BaTiO_3$, magnetic material ceramic such as ferrite can be included as an inorganic component. Further, as for the photosensitive vehicle (photosensitive organic constituent), a compound combined with, for example, copolymer of methyl methacrylate and methacrylic acid, monomer, a photo initiator and a solvent may be employed.

In addition, when the photosensitive glass is selected for the material of the insulating film 105, $Li_2O$—$Al_2O_3$—$SiO_2$ (Au, Ce) chemical machinable photosensitive glass, for example, may be employed, for the photosensitive glass. More specifically, a constitution of the insulating film 105 may contain by % wt., for example, basic components of $SiO_2$:55 to 85%, $Al_2O_3$:2 to 20%, $Li_2O$:5 to 15%, and $SiO_2$+$Al_2O_3$+$Li_2O$= 85%; a photosensitive metal components of Au:0.001 to 0.05%, Ag:0.001 to 0.5% and $Cu_2O$:0.001 to 1%; and further a photosensitizer of $CeO_2$:0.001 to 0.2%.

In this case, after the process described above in reference to FIG. 3B, the portions for forming the concave portions 111 are selectively irradiated with ultra-violet ray through a mask to form exposure crystallized portions in the insulating film 105 of the portions for forming the concave portions 111. Then, the portions of the insulating film 105 having the crystallized portions by exposure are thermally treated. Such thermal treatment may be preferably conducted at a temperature between the transition point and the yield point of the employed glass. There is a concern that a excessively lower thermal treatment temperature may provide an insufficient thermal treatment effect. On the other hand, a excessively higher thermal treatment temperature may cause a shrinkage thereof, leading to a deterioration in the dimensional accuracy. Thermal treatment time may be from about 30 minutes to about 5 hours.

Subsequently, the thermally treated insulating film 105 is immersed within a diluted hydrofluoric acid to etch only the crystallized portion by exposure. Portions of the insulating film 105 deposited on the silicon substrate 101 in the regions for forming the concave portions 111 and the region where through hole 103 is not formed are selectively dissolved by such etching to remove thereof. The concave portion 111 is formed by the above-mentioned process.

While the process of irradiating ultraviolet light over the insulating film 105 by using the photolithographic technology during the formation of the concave portion 111 in the insulating film 105 is illustrated above, an electron beam, irradiation may also be employed instead of the irradiation of ultraviolet light. If the electron beam, irradiation is employed, the material of the insulating film 105 may be an insulating material that is available in the electron beam lithographic technology.

Fourth Embodiment

Figure 11:
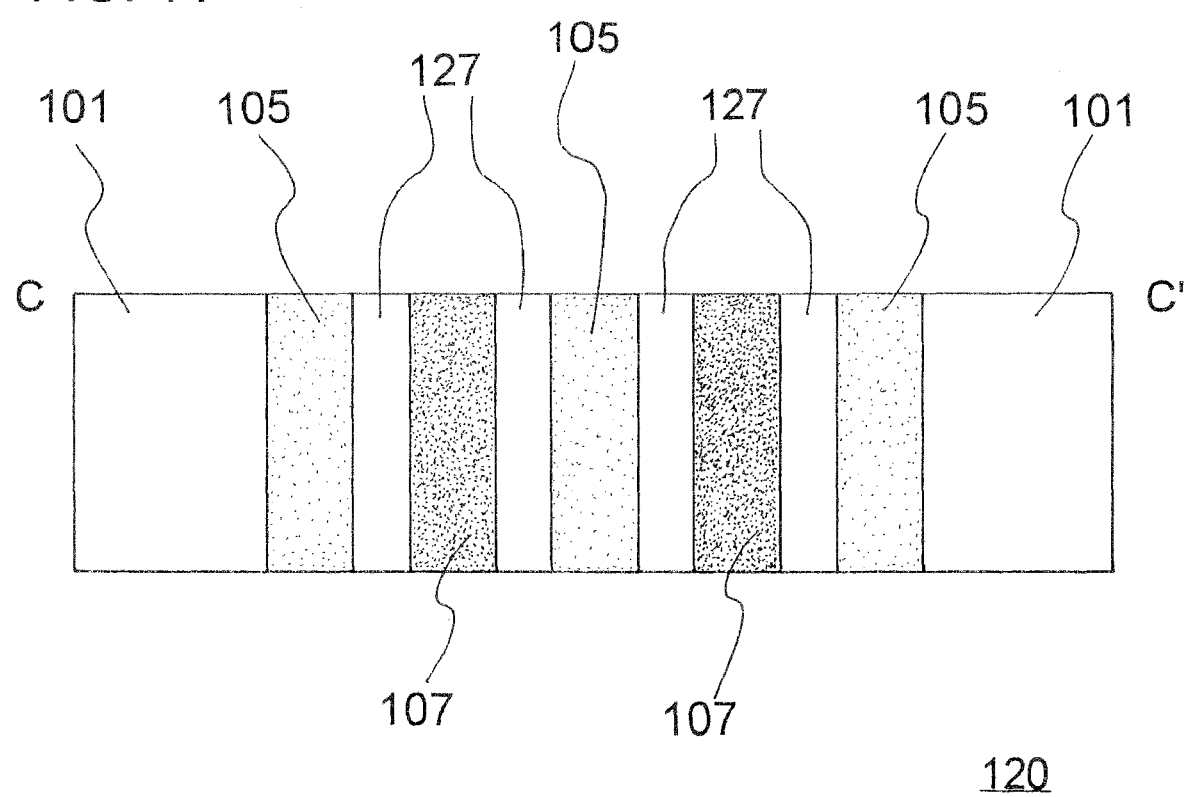
FIG. 11 is an cross-sectional view of FIG. 10 along C-C'.

FIG. 10 is a plan view, schematically showing a configuration of a semiconductor device according to the present embodiment. FIG. 11 is an cross-sectional view of FIG. 10 along C-C'. An through electrode structure 122 is provided in a silicon substrate 101 in a semiconductor device 120 shown in FIG. 10 and FIG. 11. A basic configuration of the through electrode structure 122 is almost similar to the through electrode structure 102 provided in the semiconductor device 100 (FIG. 1) as described in first embodiment, except that portions of the silicon substrate 101 are remained as silicons 127 in the through hole 103, and that the through plugs 107 are buried within holes provided in the silicons 127 that are the remaining regions. Four silicons 127 are remained in one through hole 103 in FIG. 10, and a through plug 107 is provided in each of the all four silicons 127.

While the configuration of being provided with the silicons 127 contacting with the side surface circumferences of the all through plugs 107 is illustrated in FIG. 10, a configuration of being provided with the silicons 127 on the entire side surfaces of some of through plugs 107 provided in one through hole 103 may also be employed. Such alternative configuration may be described later in fifth embodiment.

The semiconductor device 120 is manufactured as follows, by employing, for example, process described in first embodiment (FIG. 3A to FIG. 3C, FIG. 4A and FIG. 4B). First, a concave portion 153 for forming the through hole 103 is provided in the silicon substrate 101. In this case, the concave portion 153 is provided so that predetermined regions of the silicon substrate 101 are remained to form silicons 127. Next, the concave portion 153 is filled with an insulating film 105. Then, a mask having holes corresponding to regions for forming the through plugs 107 within the silicons 127 is formed by employing a photolithographic technology, and one exposed regions in the silicons 127 are selectively etched off through the mask to provide the concave portions 111. Then, electrically conducting films are buried within the concave portions 111 to form the through plugs 107. Then, the thickness of the silicon substrate 101 is reduced. As such, the semiconductor device 120 provided with the through electrode structure 122 is obtained.

Next, the advantageous effect obtainable by employing the semiconductor device 120 shown in FIG. 10 and FIG. 11 will be described as follows. Since a plurality of through plugs 107 are provided in one through hole 103 in the semiconductor device 120, the degree of integration of the electrically conducting plugs 107 can be improved, similarly as the semiconductor device described in the above-mentioned embodiment.

In addition, in the semiconductor device 120, the silicons 127 are selectively removed by the etching process when the concave portion 111 is formed in the region for providing the through plugs 107. Therefore, the etch rate for forming the concave portion 111 can be improved, as compared with the case of the above-mentioned embodiments that involves selectively removing the predetermined positions in the insulating film 105. For example, while the dry etch rate for $SiO_2$ that is the material of the insulating film 105 is about 3 μm/min, the dry etch rate for silicons 127 is about 10 to 20 μm/min. Therefore, the configuration providing a further improved manufacturing efficiency can be presented, as compared with the case of forming the concave portions 111 in the insulating film 105.

Fifth Embodiment

Figure 12:
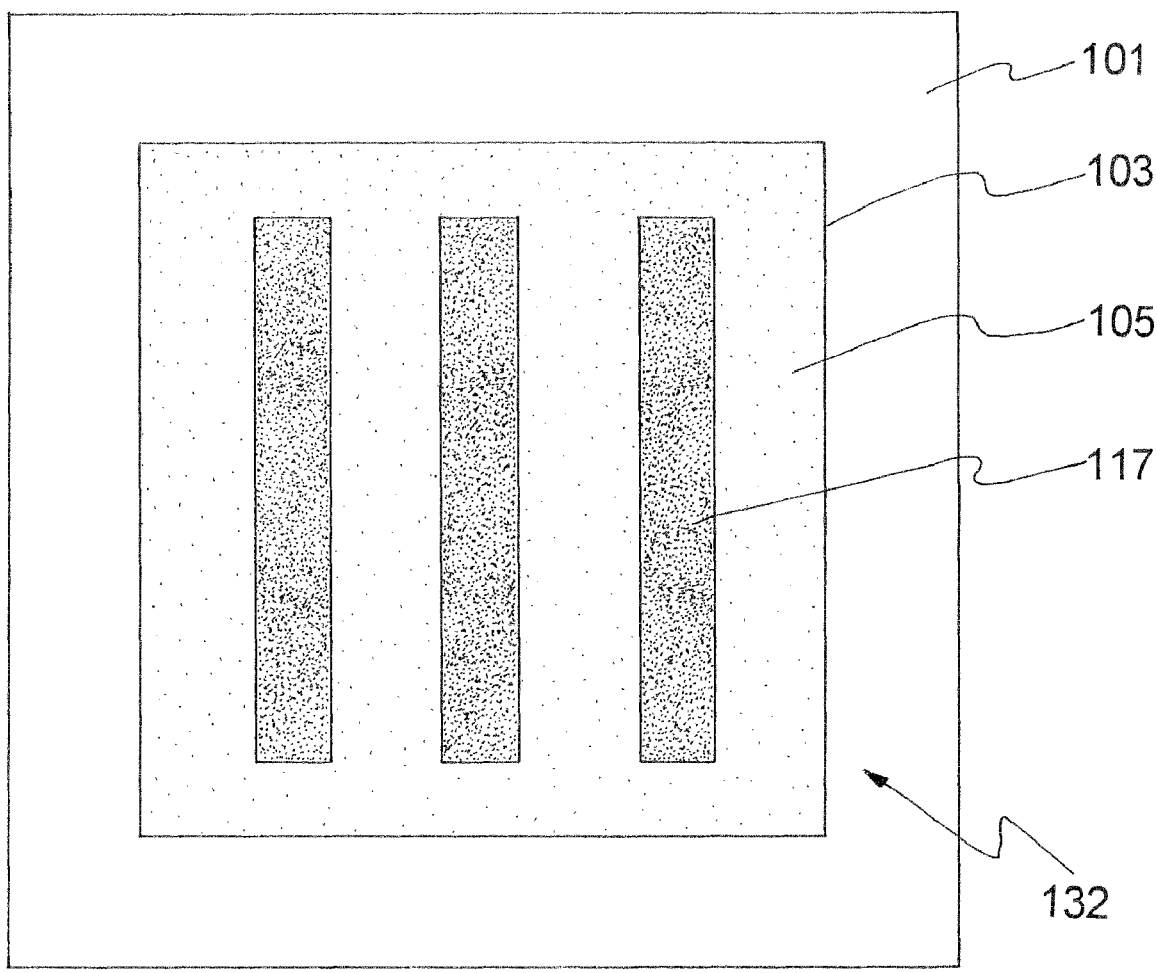
FIG. 12 is a plan view, schematically showing a configuration of a semiconductor device according to an embodiment of the present invention.

In a semiconductor device described in the above-mentioned embodiments, the geometry of the through plugs 107 may be a stripe pattern. FIG. 12 is a plan view, schematically showing a configuration of a semiconductor device 130 according to the present embodiment. The semiconductor device 130 shown in FIG. 12 has a through electrode structure 132. A basic configuration of the through electrode structure 132 is almost similar to the configuration of the through electrode structure 102 provided in the semiconductor device 100 shown in FIG. 1, except that the geometry of the through plugs 107 is a stripe pattern, each of which has a rectangular cross section, and that a plurality (3 in FIG. 12) of stripe-patterned through electrodes 117 are buried in the insulating film 105 in a mutually parallel pattern.

The semiconductor device 130 shown in FIG. 12 can be manufactured employing a process described in, for example, first or third embodiment. In the present embodiment, a plurality of mutually parallel concave portions 111 that forms a slit pattern is formed in the process for manufacturing the concave portions 111 (FIG. 3C).

Next, the advantageous effect obtainable by employing the semiconductor device 130 shown in FIG. 12 will be described as follows. Since a plurality of through plugs 107 are also buried in one insulating film 105 in the semiconductor device 130, advantageous effects similar to that obtainable in first to fourth embodiments can also be obtained.

In addition, an alternative configuration, in which one concave portions 111 are designed to be slit vias and the stripe-patterned through electrodes 117 are buried therein, may be employed to provide an improved filling characteristic of the electrically conducting film.

In addition, each of the plurality of adjacent stripe-patterned through electrodes 117 are mutually isolated as each of them is buried within the insulating film 105, and not within the silicon substrate 101, such that a generation of a capacitance between two opposite surfaces of the through electrode 117 can be inhibited when all the stripe-patterned through electrodes 117 are connected to one interconnect. Therefore, a parasitic capacitance of the stripe-patterned through electrodes 117 can be reduced, as compared with the case provided with a long slit via having the same total length thereof. For example, when a parallel plate capacitor is formed of adjacent stripe-patterned through electrodes 117, the parasitic capacitance thereof can be reduced by a capacitive component of the insulating film 105 in the interior of the capacitor, as discussed later.

The semiconductor device 130 of the present embodiment also has the configuration, in which a plurality of stripe-patterned through plugs 107 are buried in one insulating film 105 with a mutually parallel manner. Therefore, the stripe-patterned through electrode 117 is ensured to be electrically insulated from the peripheral silicon substrate 101. In addition, a relative dielectric constant of the generally employee insulating film 105 ($SiO_2$, about 4) is significantly small, as compared with a relative dielectric constant of the silicon (about 12), which is a substrate material. Accordingly, the interval between the stripe-patterned through electrodes 117 can be decreased under the same parasitic capacitance in the semiconductor device 130, as compared with the conventional configuration including two or more parallel plate through electrodes that are arranged facing across the silicon. Therefore, the configuration of the semiconductor device 130 provides an improvement in the arranging density of the stripe-patterned through electrodes 117, without increasing the parasitic capacitance generated by each of the stripe-patterned through electrodes 117.

Further, the semiconductor device 130 has a configuration, in which the capacitor and the through electrodes can be formed in one through hole 103 in the same process. In this case, the semiconductor device 130 may have a configuration that can produce a potential difference between two adjacent through plug 107. An example of the configuration may be that each of the two through plugs 107 are connected to a different interconnect (not shown).

More specifically, metal-insulator-metal (MIM) capacitor may be formed by two adjacent stripe-patterned through electrodes 117. Specifically, two different interconnects are connected to two adjacent stripe-patterned through electrodes 117 that are the adjacent two parallel plate electrodes, respectively. Then, the film thickness of the insulating film 105 and the area of the facing surfaces of the stripe-patterned through electrodes 117 may be adjusted to form a status, where electrically conducting films such as metallic films composing the stripe-patterned through electrodes 117 are disposed to mutually face across the insulating film 105, thereby providing the MIM capacitor.

Further, a portion of the through electrode structure 132 may be utilized as a capacitor, and a power supply and a ground are connected to such capacitor, thereby allowing such capacitor to be utilized as a decoupling capacitor of a peripheral of the circuit. Further, another capacitor may also be formed between the signal lines. Moreover, a utilization as a trench capacitor in the circuit may also be available. In this case, the surface area can be reduced, as compared with a case of an ordinary/MIM capacitor. The semiconductor device 130 having such type of capacitor may be preferably utilized as, for example, DRAM.

Figure 13:
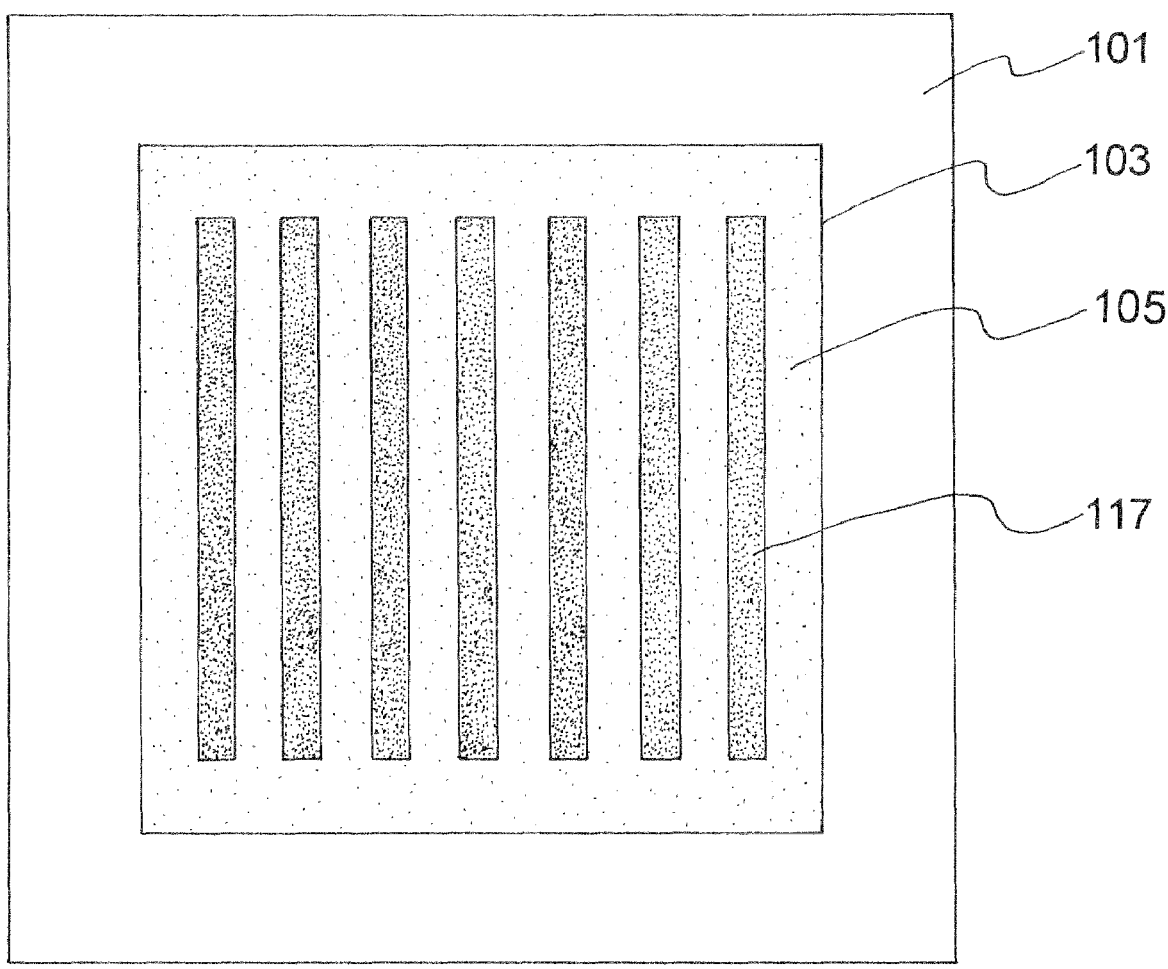
FIG. 13 is a plan view, schematically showing a configuration of a semiconductor device according to an embodiment of the present invention.

While a configuration having three mutually parallel stripe-patterned through electrodes 117 buried in one insulating film 105 is illustrated in FIG. 12, number of the stripe-patterned through electrodes 117 per one through hole 103 is not particularly limited, if it is any plural number, and may be suitably selected according to the design of the device. FIG. 13 is a plan view, illustrating a semiconductor device having a configuration providing seven stripe-patterned through electrodes 117 in one through hole 103. As shown in FIG. 13, the stripe-patterned through electrodes 117 can be provided with higher degree of integration within the region of smaller area, by increasing number of the stripe-patterned through electrodes 117 per one through hole 103.

Figure 14:
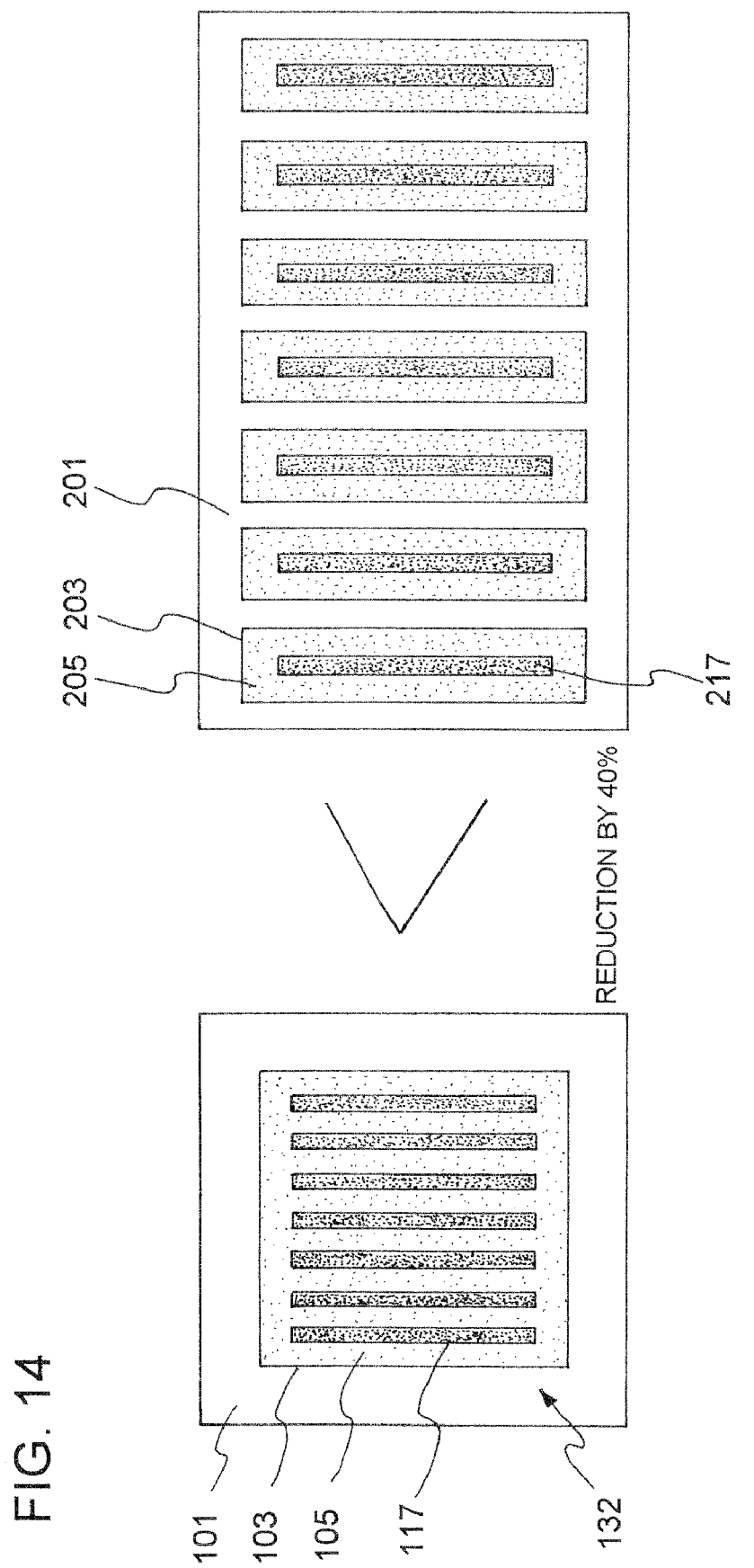
FIG. 14 is a view, explaining a configuration of a semiconductor device according to an embodiment of the present invention.

In the configuration shown in FIG. 13, area of the region for forming the through electrode structure can be further reduced, as compared with the conventional configuration, in which one through plug 107 is provided in one through hole 103. FIG. 14 is a diagram, which is useful in describing this advantageous effect. For example, it is assumed that disposing a predetermined element in a region around the through hole 103 (vias) is taken into consideration and that an "element keep-out" area is a rectangular-shaped spaced apart from the through hole 103 at a certain distance. More specifically, an area that the through electrode structure 132 occupies on the silicon substrate 101 is calculated under assumptions of: width of the through hole 103 in the horizontal plane of the substrate=1; width of the insulating film 105=1; distance between the through holes 103= 1; region for forming the through electrode structure 132=rectangle (of (through hole 103 formation area)+1 on each side).

Then, seven through holes 203 are independently provided in the silicon substrate 201, and the insulating film 205 is buried in 3 each of the through holes 203. Therefore, having the configuration of the present embodiment (left side in the diagram), required area of the region for forming the through electrode structure 132 can be reduced by 40%, as compared with the conventional configuration (the right side in the diagram), where one stripe-patterned through electrode 217 having the geometry same as the stripe-patterned through electrode 117 is provided in one insulating film 205. While this effect obtained by reducing the area depends upon the interval between the stripe-patterned through electrodes 117, higher advantageous effects can be obtained, dependent on the arrangement thereof or required specifications.

Figure 15:
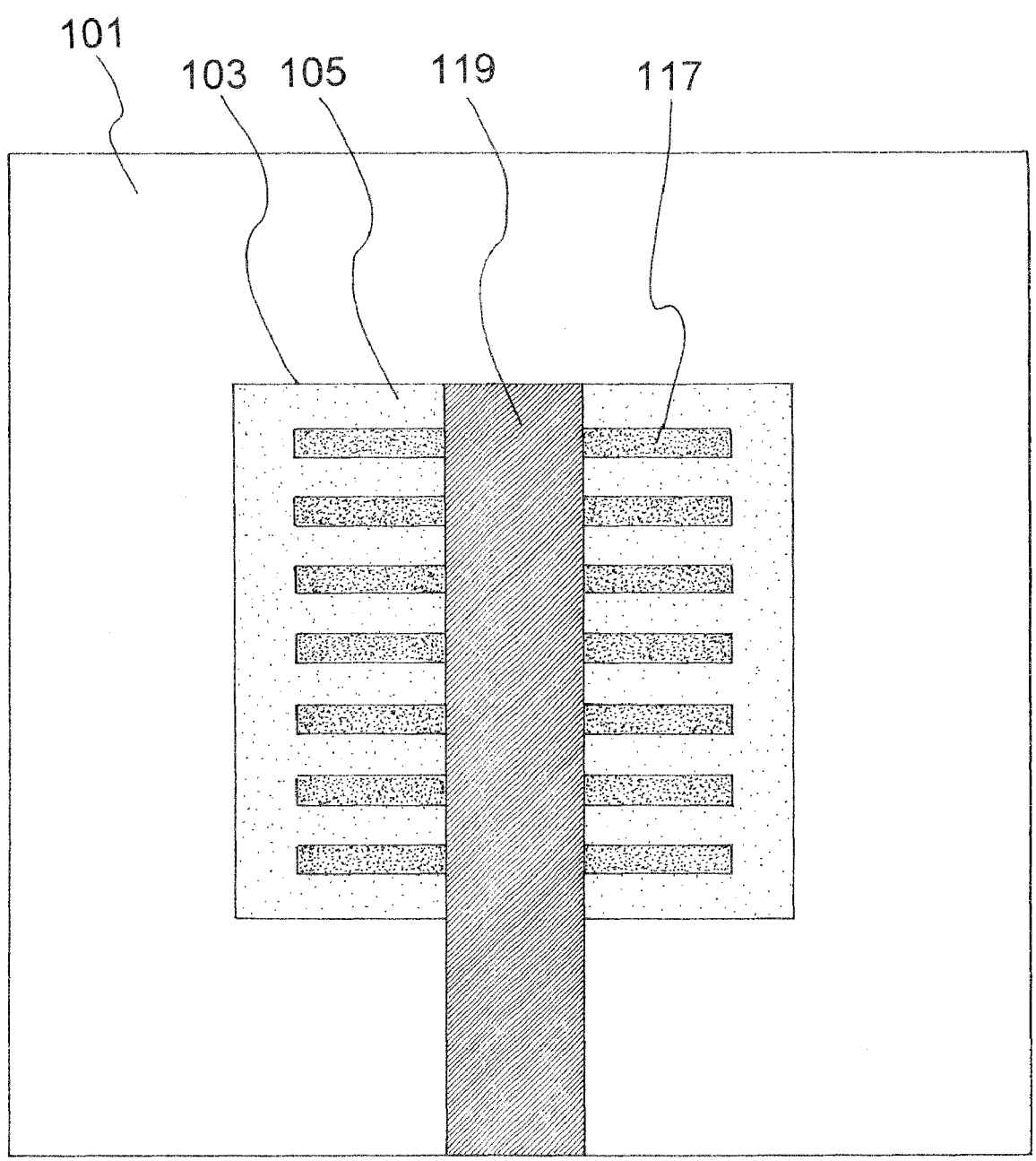
FIG. 15 is a plan view, schematically showing a configuration of a semiconductor device according to an embodiment of the present invention.

In the semiconductor device shown with FIG. 13, a configuration shown in FIG. 15, for example, may be employed, when a plurality of stripe-patterned through electrodes 117 are electrically connected. FIG. 15 is a plan view, illustrating a configuration of the semiconductor device shown with FIG. 13, where a plurality of stripe-patterned through electrodes 117 are connected to a single-layered, interconnect. The stripe-patterned through electrodes 117 buried within the insulating film 105 in the through hole 103 can be further stably connected by providing an interconnect 119 from, one end to another end of the through hole 103 on the element formation surface of the silicon substrate 101, as shown in FIG. 15. Moreover, the connecting reliability between the interconnect 119 and the through electrode structure can be improved.

In addition, while a configuration provided with a plurality of stripe-patterned through electrodes 117 having the same geometry are provided in one through hole 103 is illustrated in the above descriptions, a configuration provided with the stripe-patterned through electrodes 117 having different widths along the longitudinal direction in the horizontal plane of the substrate in one through hole 103 may also be employed.

Figure 16:
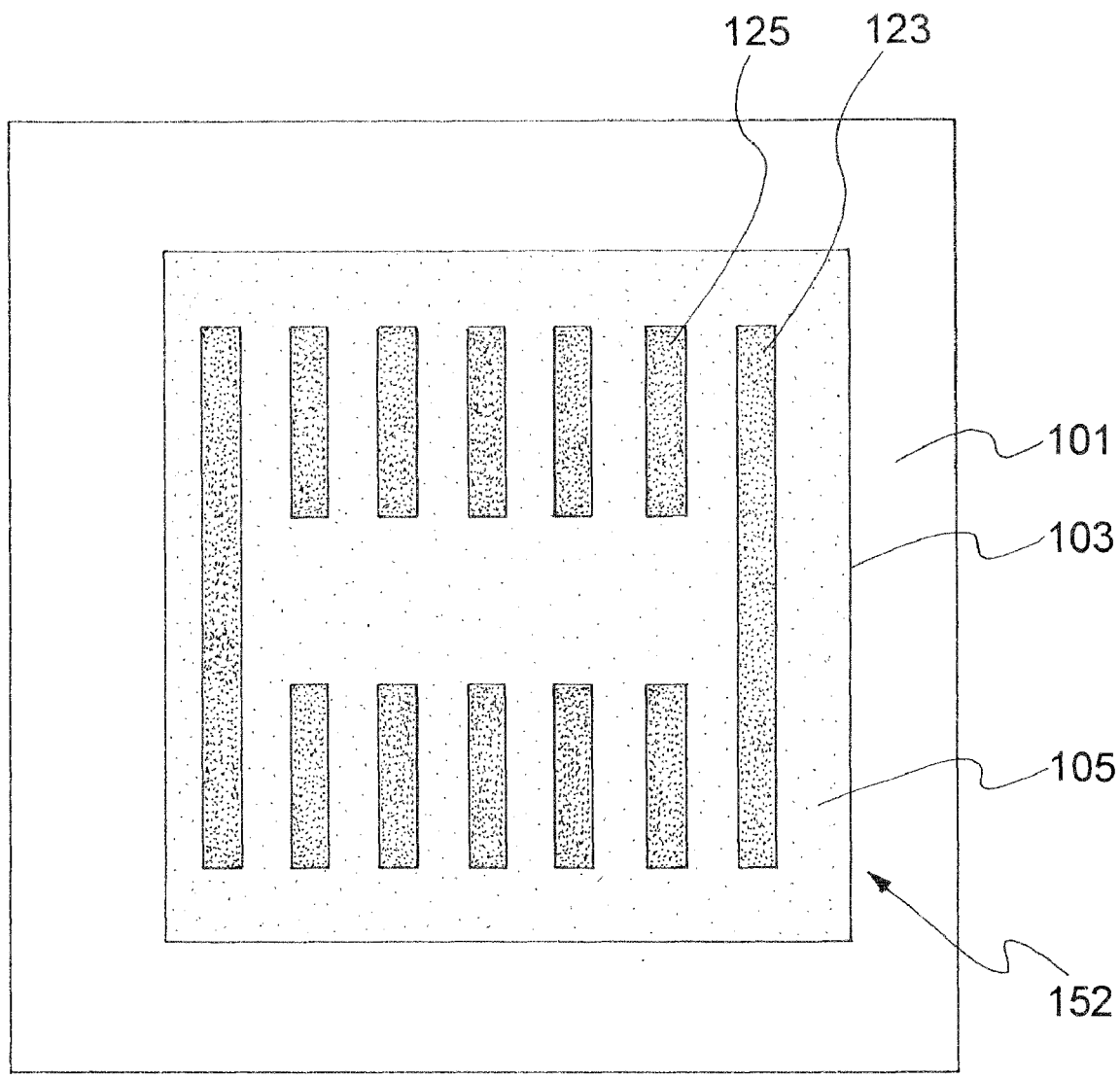
FIG. 16 is a plan view, schematically showing a configuration 3 of a semiconductor device according to an embodiment of the present invention.

FIG. 16 is a plan view, illustrating a configuration of a semiconductor device having a plurality of stripe-patterned, through electrodes of different lengths. In a semiconductor device 150 shown in FIG. 16, a through electrode structure 152 is buried in a silicon substrate 101. A basic configuration of the through electrode structure 152 is almost similar to the through electrode structure provided in the semiconductor device shown in FIG. 13, except that the stripe-patterned through electrodes 123 and the stripe-patterned through electrodes 125 are buried within the insulating film 105 in a mutually parallel manner, instead of the stripe-patterned through electrodes 117. The two stripe-patterned through electrodes 123 disposed in the side of the end of the insulating film 105 have longer length, and shorter stripe-patterned through electrodes 125 are provided between the stripe-patterned through electrodes 123. In the configuration shown in FIG. 16, two shorter stripe-patterned through electrodes 125 are provided in each of five lines, and a longer stripe-patterned through electrode 123 is disposed in each side thereof.

Having the configuration shown in FIG. 16, for example, the shorter stripe-patterned through electrodes 125 can be connected to a signal interconnect, and the longer stripe-patterned through electrodes 123 can be connected to a power supply and a GND interconnect. This can provide a plurality of functions in the stripe-patterned through plugs buried in one insulating film 105, and the connection among the signal interconnect, the power supply and the GND interconnect via the through electrode structure 152 can be more effectively presented.

Sixth Embodiment

The semiconductor device described in fifth embodiment may have an additional configuration, in which, similarly as in the case of fourth embodiment, a silicon 127 is provided in at least a portion of a side circumference of a plurality of stripe-patterned through electrodes 117 so as to contacts therewith.

Figure 17:
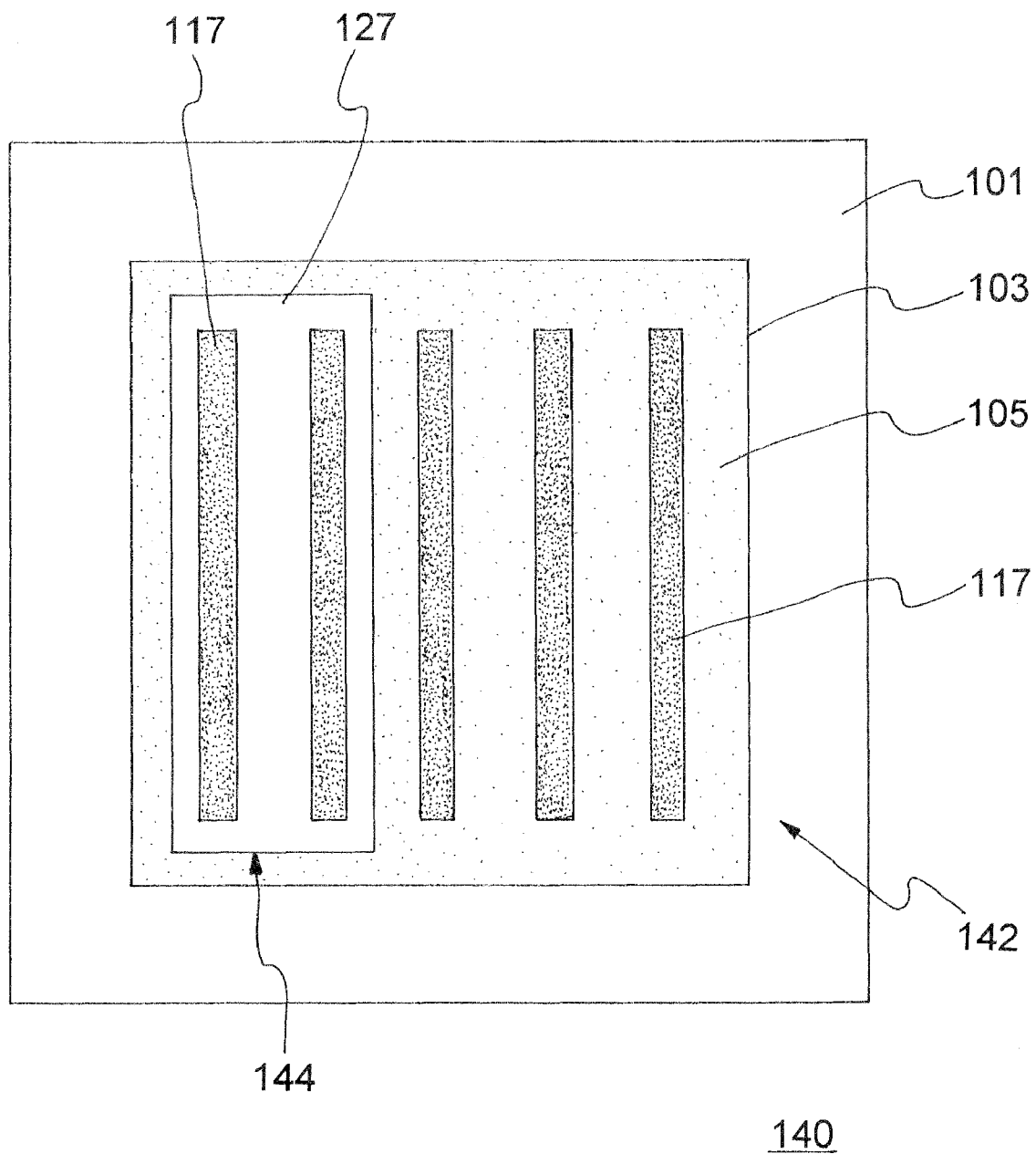
FIG. 17 is a plan view, schematically showing a configuration of a semiconductor device according to an embodiment of the present invention.

FIG. 17 is a plan view, schematically showing a configuration of a semiconductor device according to the present embodiment. A semiconductor device 140 shown in FIG. 17 has additional features in addition to the configuration of the semiconductor device 130 described in the fifth embodiment (FIG. 12), in chat the silicon 127 is buried, in the insulating film 105, two stripe-patterned, through electrodes 117 are buried in the silicon 127, and three stripe-patterned through electrodes 117 are buried in the insulating film 105. The five stripe-patterned through electrodes 117 have the same geometry, and they are disposed in a mutually parallel manner.

In the semiconductor device 140, two stripe-patterned through electrodes 117 are arranged to face through the silicon 127 to form a capacitor 144. This can provide utilizing the silicon 127 as a capacitive film, thereby enhancing the capacitance, as compared with the configuration, in which the stripe-patterned, through electrodes 117 are buried within the insulating film 105 in the capacitor 144 in addition, since the stripe-patterned through, electrode 117 is buried within the insulating film 105 in regions except the capacitor 144, the parasitic capacitance of the stripe-patterned through electrodes 117 can be reduced. Therefore, the capacitor 144 and the stripe-patterned through electrode 117 employed for the interconnect can be provided in one insulating film 105. Thus, one piece of silicon substrate 101 can further be effectively utilized.

Seventh Embodiment

The semiconductor devices described in the above-mentioned embodiments may have an additional configuration, in which, a plurality of through electrode having substantially different cross-sectional sectional geometries or cross sectional areas in the horizontal plane of the silicon substrate 101 are provided in the insulating film 105 buried within one through hole 103. Typical configuration thereof may include, for example, the semiconductor device 150 described above in fifth embodiment (FIG. 16).

Figure 18:
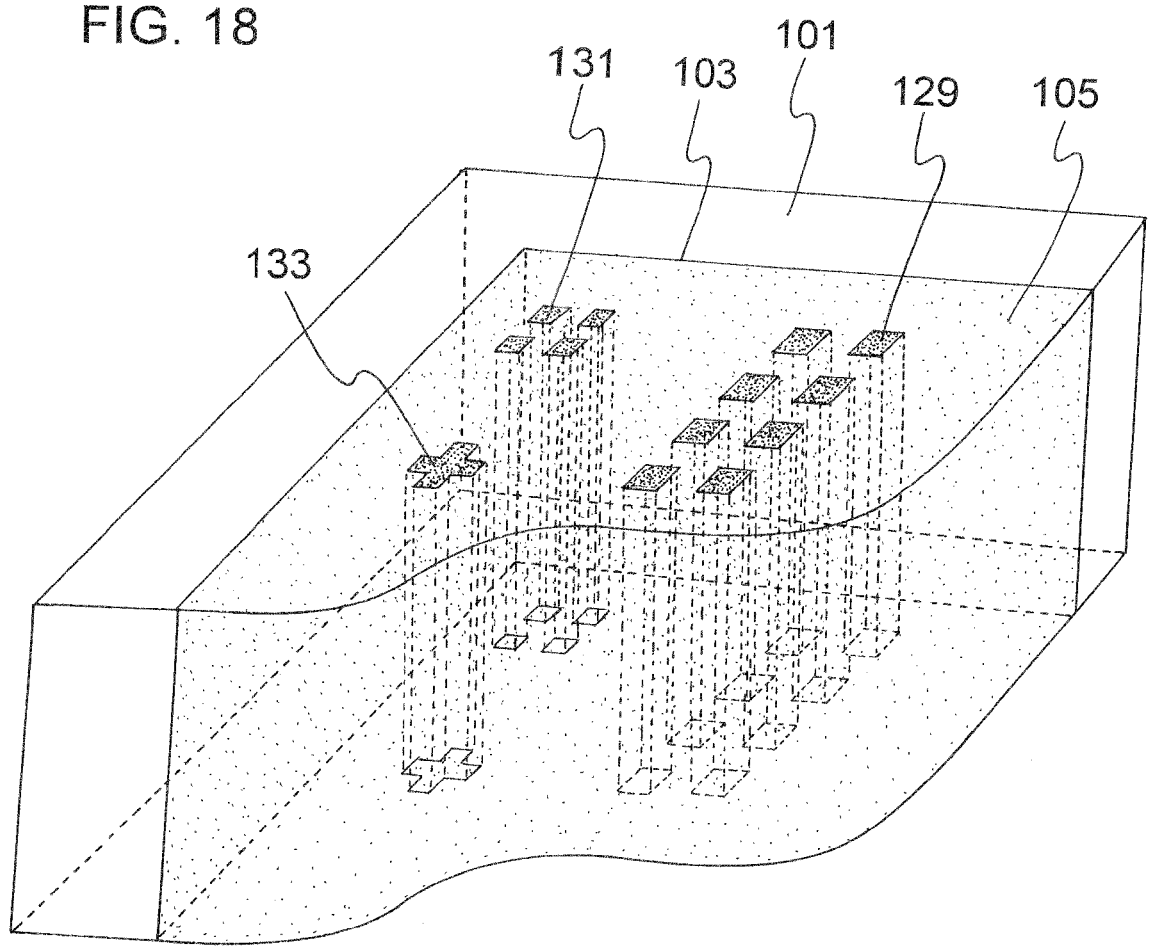
FIG. 18 is a perspective view, schematically showing a configuration of a semiconductor device according to an embodiment of the present, invention.

FIG. 18 is a perspective view, schematically showing a configuration of another semiconductor device according to the present embodiment. The semiconductor device shown in FIG. 18 includes a silicon substrate 101, a through hole 103 extending through the silicon substrate 101 and an insulating film 105 buried within the through hole 103, and an interior of the insulating film 105 is provided with electrically conducting plugs 129, electrically conducting plugs 131 and an electrically conducting plug 133, which have different cross-sectional geometries. In the configuration illustrated in FIG. 18, the cross-sectional geometry of the electrically conducting plugs 129 and the electrically conducting plugs 131 in the horizontal plane of the silicon substrate 101 is square, and the cross-sectional geometry of electrically conducting plug 133 is crisscross.

Since a plurality of through plugs are also buried in one insulating film 105 in the semiconductor device shown in FIG. 18, advantageous effects similar to that obtainable in the above-described embodiments can also be obtained. In addition, since a plurality of electrically conducting plugs having different cross-sectional geometries are buried in one insulating film 105, a plurality of through electrodes having different electrical characteristics (for example, resistance, capacitance, impedance) can be obtained in one manufacturing process.

In addition, geometries of the respective concave portions 111 can be controlled by designing reticles, when a photolithography is employed for forming holes in the insulating film 105 to form the concave portions 111 (FIG. 3C, for example). Therefore, vias of different structures, such as a combination of a slit via and an ordinary circular via and the like, can be simultaneously formed in the same insulating film 105. In addition, the electrical characteristics (resistance, capacitance, impedance) of the individual through electrodes can be independently controlled even in the same process.

Eighth Embodiment

While the configurations providing one through hole 103 in one piece of silicon substrate 101 are exemplified in the above-mentioned embodiment, number of through holes 103 provided in the silicon substrate 101 may suitably be determined according to the design of the semiconductor device.

Figure 19:
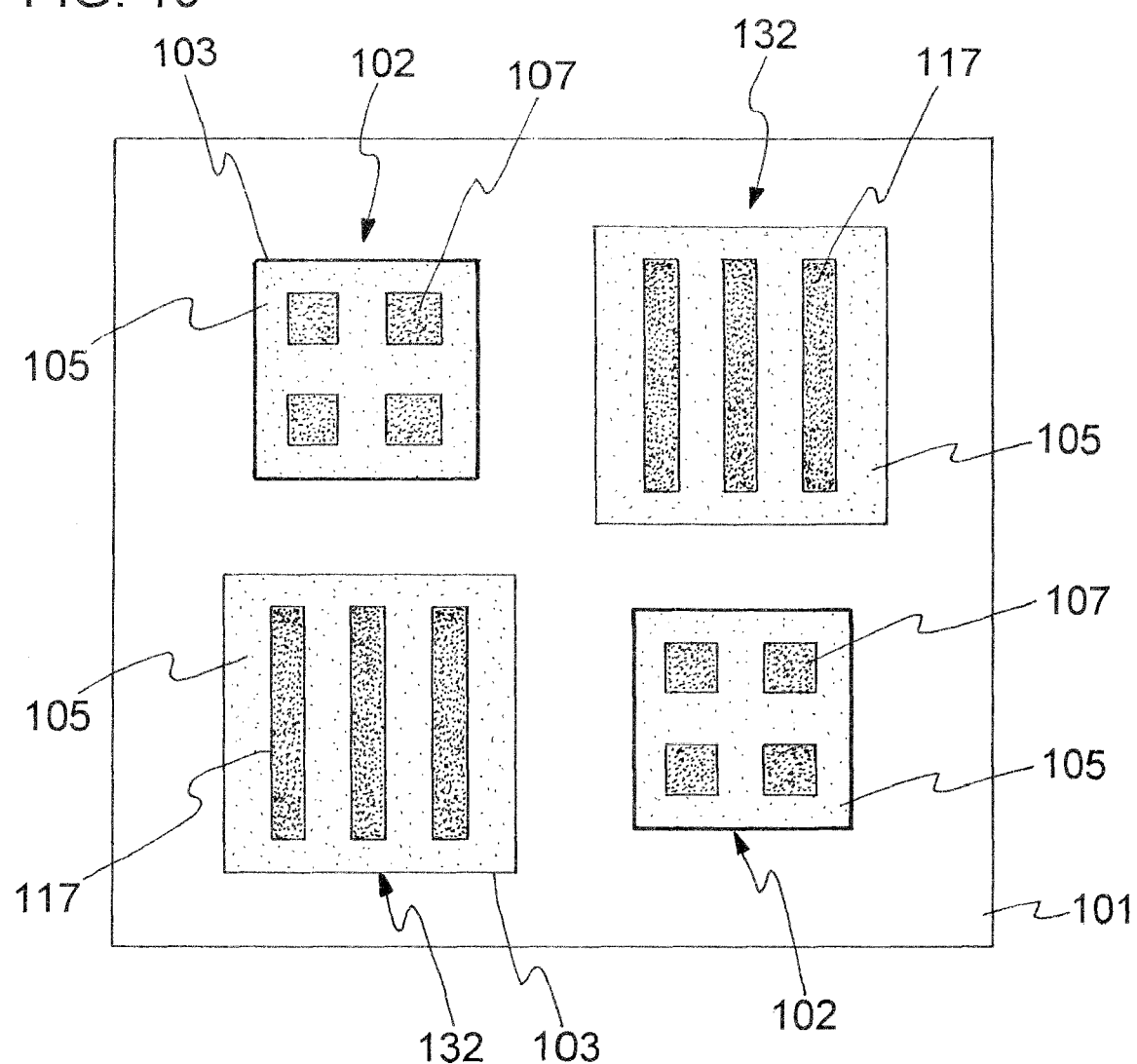
FIG. 19 is a plan view, schematically showing a configuration of a semiconductor device according to an embodiment of the present invention.

FIG. 19 is a plan view, schematically showing a configuration of a semiconductor device provided with a plurality of through holes 103. The semiconductor device shown in FIG. 19 includes two through electrode structures 102 described in first embodiment (FIG. 1) and two through electrode structures 132 described in fifth embodiment (FIG. 12). The dimension of the through hole 103 having the through electrode structure 102 buried therein is different from the dimension of the through hole 103 having the through electrode structure 132 buried therein.

In she semiconductor device shown in FIG. 19, the through electrode structures 102 suitable for the signal line and the through electrode structures 132 suitable for power line or GND can be disposed on one silicon substrate 101. In addition, the through electrode structures 102 and the through electrode structures 132 can be manufactured in the same process, leading to provide a simple manufacturing process.

In this case, when the silicon substrate 101 is provided with a plurality of through holes 103, the geometries and the dimensions of the through holes 103 can be suitably determined according to the configuration of the semiconductor device. For example, a configuration, in which cross-sectional geometries of a plurality of through holes 103 are substantially same, and cross-sectional geometries, cross sectional areas or layout of a plurality of through electrodes in a plurality of through holes 103 are different in the horizontal plane of silicon substrate 101, may be employed. More specifically, in FIG. 19, the through holes 103 may have the same geometry or dimension. Further, geometries, sizes and number of the through plugs 107 or the stripe-patterned through electrodes 117 provided in the through holes 103 may be suitably determined according to the apparatus configuration. Degree of flexibility in designing the through electrode structure can be further improved by providing a plurality of through holes 103 having different geometries or dimensions in one piece of the silicon substrate 101.

Ninth Embodiment

The semiconductor devices described in the above-mentioned embodiments may be preferably employed in a multiple-chip module or the like. The multiple-chip module includes, for example, a stacked structure of semiconductor devices according to the above-mentioned embodiments and other semiconductor devices, and may have a configuration, in which a plurality of through electrodes extending through the silicon substrate 101 are connected to conductive members of other semiconductor devices adjacent to the semiconductor devices described in the above embodiments.

Figure 20:
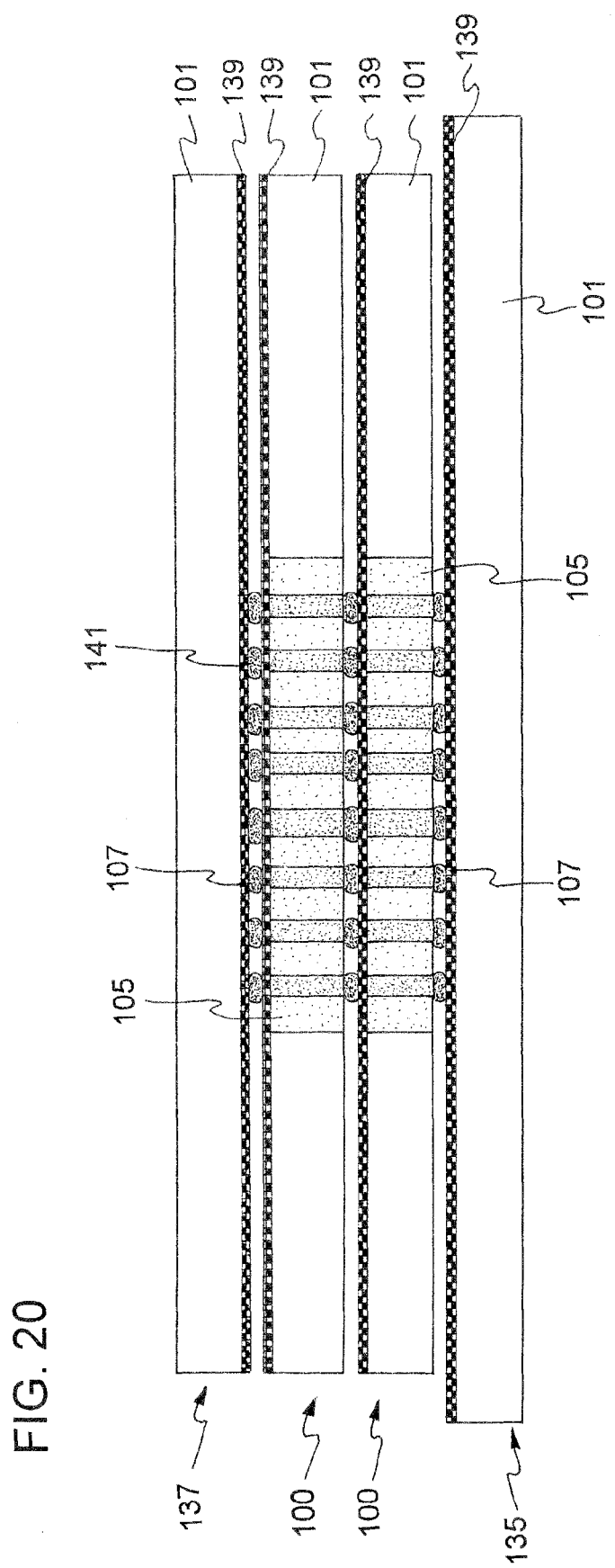
FIG. 20 is a cross-sectional view, schematically showing a configuration of a multiple-chip module according to an embodiment of the present invention.

FIG. 20 is a cross-sectional view, schematically showing a configuration of a multiple-chip module according to the present embodiment. FIG. 20 illustrates a configuration, in which four levels of silicon substrates 101 are stacked to form, a multi-layered structure and no through electrode structure is provided in the silicon substrates 101 of a semiconductor device 137 in the top layer and the semiconductor device 135 in the bottom layer. Further, a case of employing the device having an increased number of through plugs 107 as the semiconductor device except the top and the bottom layers in the semiconductor device 100 shown in FIG. 1 is exemplified. Further, element formation surfaces 139 are disposed in the upper side thereof in the diagram for the semiconductor device 135 and the two semiconductor devices 100, and an element formation surface 139 of the semiconductor device 137 is disposed in the lower side thereof in the diagram to face the element formation surface 139 of the semiconductor device 100.

In FIG. 20, the through plugs 107 provided, in the through electrode structures 102 of respective semiconductor devices 100 are aligned along a straight line extending in a direction normal to the surface of the silicon substrate 101. The through plugs 107 are mutually connected via bumps 141. This can provide electrical connections between the semiconductor devices in the multiple layers in smaller areas. Further, the connection density can also be improved. In addition, since a plurality of through plugs 107 can be connected to the conductive members provided on the element formation surfaces 139, these contact areas can be increased. Thus, reduction in the contact resistance can be achieved. In addition, since the electrical connections can be provided through a plurality of through plugs 107 an improved electrical connection reliability can be presented.

The semiconductor device 100 may be a device having an active element, for example. In addition, such stacked structure may typically include, for example, a multiple-layered structure of same memory, a multiple-layered structure of different memories, a mixed-mounted structure of memories and logics, a multiple-layered structure of logics having different functions, a multiple-layered structure of LSI chips having different semiconductor substrates such as a combination of a silicon substrate and a compound semiconductor substrate, or the like. Further, number of the multiple-layers is not particularly limited, and this configuration can be generally applied to stacked semiconductor device of two layers or more.

Figure 21:
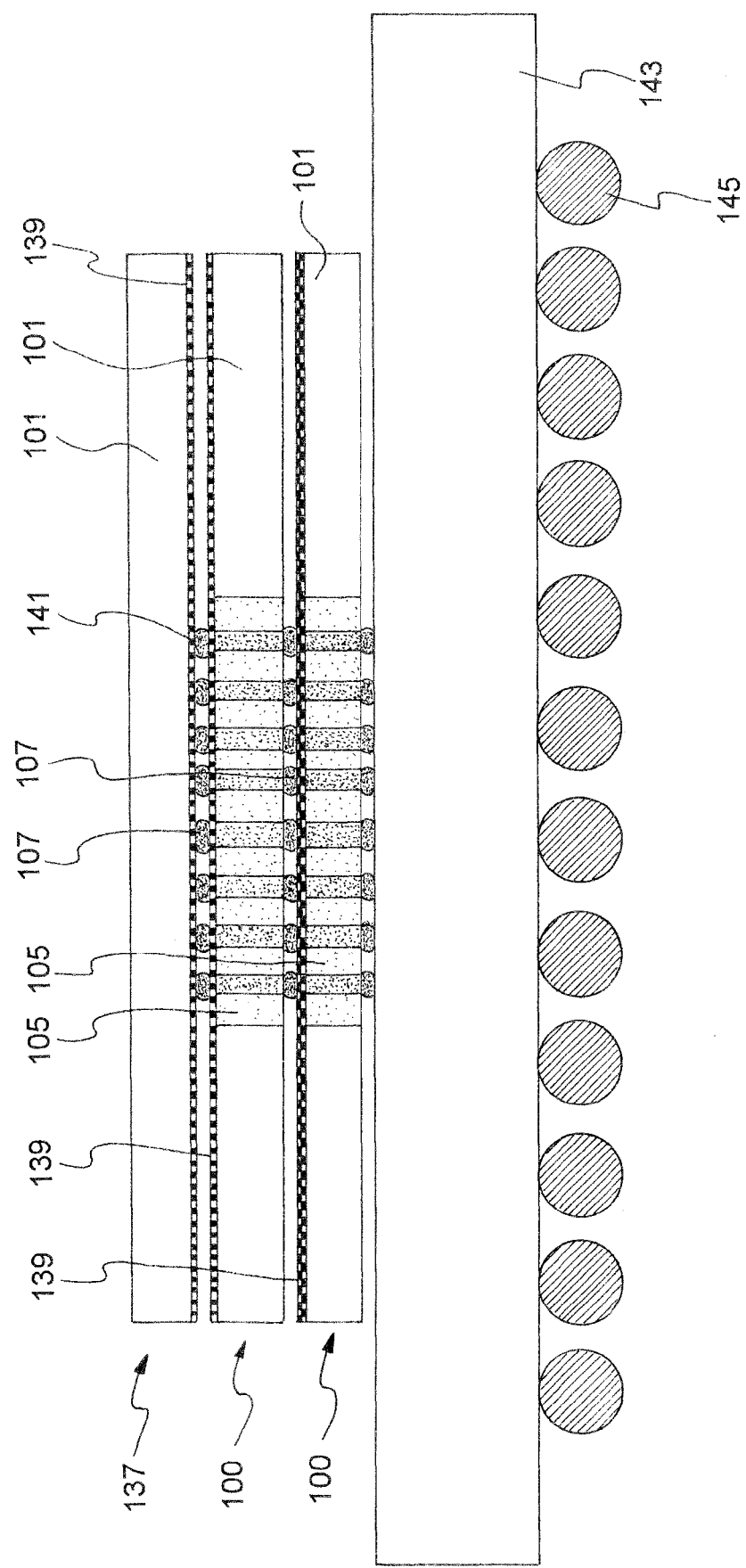
FIG. 21 is a cross-sectional view, schematically showing a configuration of a multiple-chip module according to an embodiment of the present invention.
Figure 22:
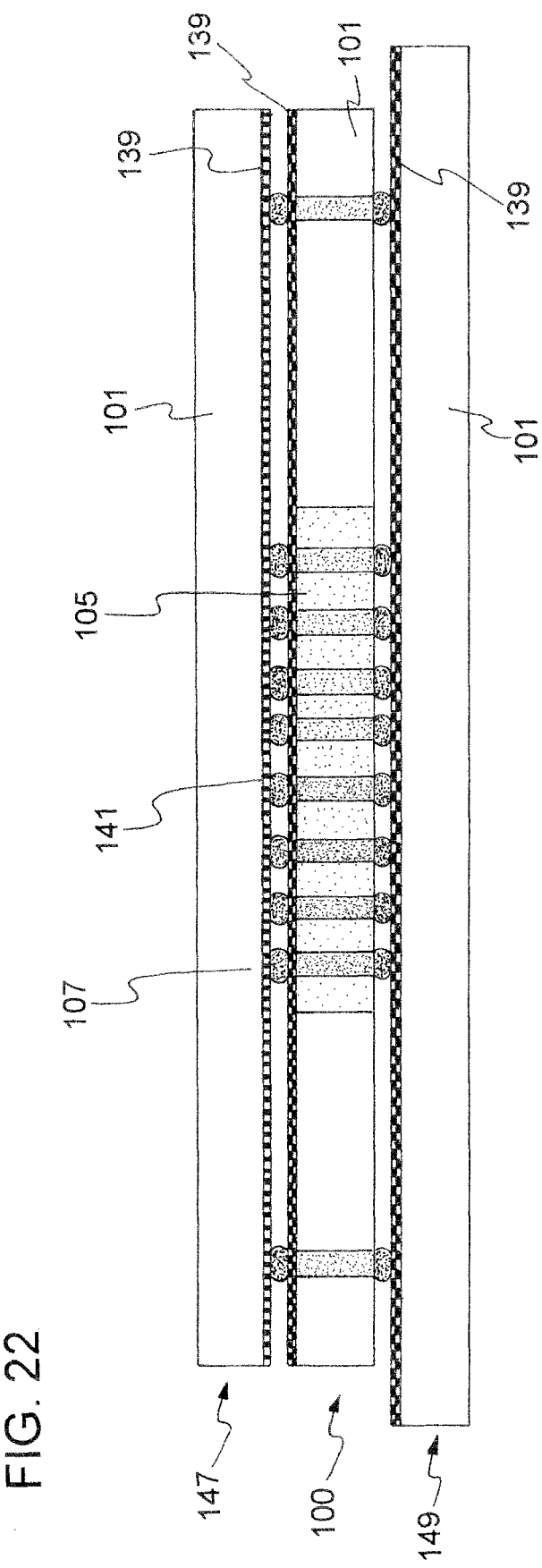
FIG. 22 is a cross-sectional view, schematically showing a configuration of a multiple-chip module according to an embodiment of the present invention.
Figure 23:
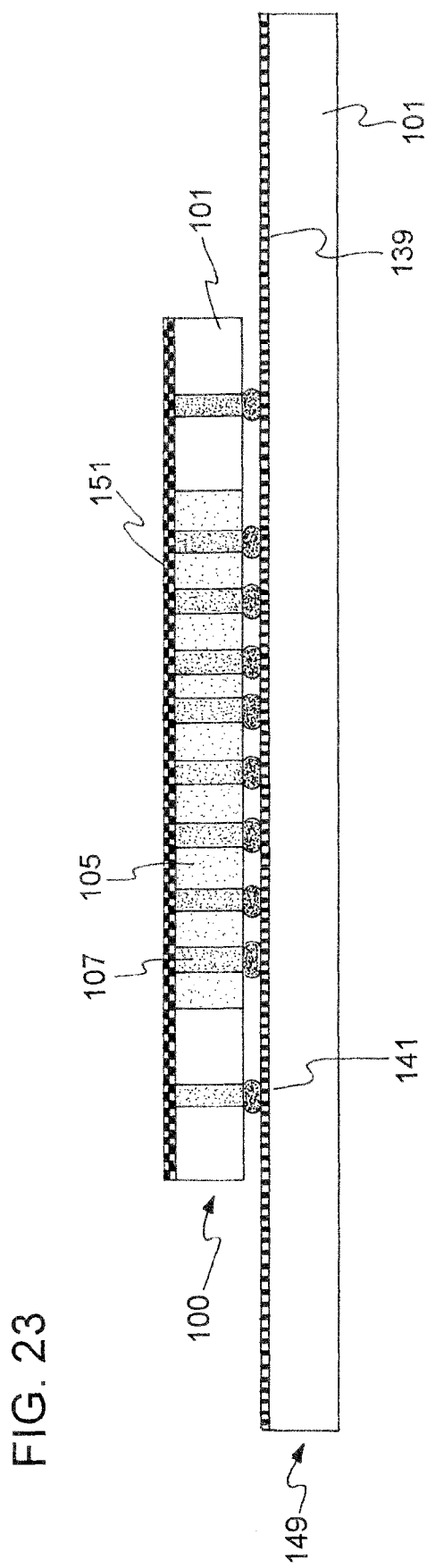
FIG. 23 is a cross-sectional view, schematically showing a configuration of a multiple-chip module according to an embodiment of the present invention.

FIG. 21 to FIG. 23 are cross-sectional views, schematically showing other exemplary configurations of multiple-chip modules according to the present embodiment. The multiple-chip module shown in FIG. 21 includes a multiple-layered structure having a semiconductor device 100, another semiconductor device 100 and a semiconductor device 137 stacked in this sequence. The through plugs 107 are provided in the semiconductor device 100 provided in the bottom layer, and the through plugs 107 of the semiconductor device 100 in the bottom layer are joined to a flip chip ball grid array (FCBGA) substrate 143. As such, the through electrode structure of the semiconductor device described in the above-mentioned embodiment can be employed in forming a junction between the LSI chip and the packaging substrate. Having this configuration, the packaging with multiple pin and narrower pitch can be further definitely achieved. Further, sufficient electrical connection with the FCBGA substrate 143 can be ensured within a smaller area.

FIG. 22 illustrates an exemplary configuration of a stacked structure, having semiconductor devices including no active element such as interposers. In FIG. 22, an LSI chip 149, a semiconductor device 100 and an LSI chip 147 are stacked in this sequence, and an electric connection between the LSI chip 147 and the LSI chip 149 is ensured via a plurality of through plugs 107 provided, in the semiconductor device 100.

FIG. 23 illustrates an exemplary configuration of a stacked structure, having an optical device on an LSI chip. In FIG. 23, an LSI chip 149 and a semiconductor device 100 are stacked in this sequence. Here, the semiconductor device 100 is an optical device having a photo-accepting/photo-emitting surface 151. Since the formation of the stacked structure can not be conducted in a face-down position because of a functional reason in this case, a through hole 103 is required to be provided to form electrical connections via the through plugs 107 in case of stacking the two layers, as illustrated. Since a plurality of through plugs 107 are provided in the through hole 103 in the semiconductor device 100, the photo-accepting/photo-emitting surface 151 and the element formation surface 139 can be surely connected with a smaller area.

While the exemplary case of applying the configuration of the semiconductor device described in the above-mentioned embodiments in the assembling equipment of the combination of chip and chip (die-on-die structure) is described above, the through electrode structure according to the above-mentioned embodiments can also be applied in a die-on-wafer structure, in which the chips are built-up on the wafer and then a dicing is conducted thereto, and a technology for forming multiple-wafer, in which wafers themselves are stacked, and then an individual multiple-chip module is cut out therefrom by a dicing process.

Further, a semiconductor device having stripe-patterned through electrodes 117 may be applied in a multiple-chip module, and when the stripe-patterned through electrodes 117 are mutually coupled with conductive members such as humps, a configuration having smaller number of stripe-patterned through electrodes 117 as the level of the layer including the semiconductor device is increased. Having such configuration, the number of the required stripe-patterned through electrodes 117 can be minimum.

Further, the semiconductor device 100 having a seed layer 115 described in second embodiment may be employed for the multiple-chip module, and the seed layer 115 on the element formation surface is left, so that a noise generated between the silicon substrates 101 can be removed.

While the preferred embodiments of the present invention have been described above in reference no the annexed figures, it should be understood that the disclosures above are presented for the purpose of illustrating the present invention, and various configurations other than the above-described configurations can also be adopted.

For example, while the case of depositing the insulating film 105 with the applying process is illustrated in the above-mentioned embodiments, CVD process may also be used for depositing the insulating film 105.

Further, the case of employing the send conductor device including the silicon substrate 101 is illustrated in the above-mentioned embodiments, a compound semiconductor substrate such as GaAs substrate and InP substrate may also be employed for the semiconductor substrate.

In addition, when the semiconductor device described in the above-mentioned embodiments is manufactured, the concave portion 153 may be formed on the element, formation surface of the silicon substrate 101, or on the back surface thereof (FIG. 3A). The process for forming the concave portion 111 (FIG. 3C) can be conducted from the back surface of the silicon substrate 101 by providing the concave portion 153 on the back surface thereof. Therefore, devices provided, on the element formation surface can be surely protected.

It is apparent that the present invention is not limited to the above embodiment, that may be modified and changed without departing from the scope and spirit of the invention.

The invention claimed is:

1. A method for manufacturing a semiconductor device, comprising:
   providing a first hole in one surface of a semiconductor substrate;
   providing an insulating film to fill said first hole;
   providing a plurality of second holes in said insulating film, said second holes extending from said one surface;
   forming a plurality of first electrically conducting films to fill the respective second holes;
   removing a portion of said semiconductor substrate at the other surface thereof to reduce a thickness of said semiconductor substrate; and exposing said first electrically conducting films.

2. The method according to claim 1, wherein:
   said insulating film is composed of a photosensitive material, and said providing a plurality of said second holes includes selectively irradiating with ultraviolet a predetermined region of said photosensitive material.

3. A method for manufacturing a semiconductor device, comprising:
   providing a first hole in one surface of a semiconductor substrate to provide a remaining portion of said semiconductor substrate inside said first hole;
   providing an insulating film to fill said first hole;
   providing a plurality of second holes in said remaining portion of said semiconductor substrate, said second holes extending from said one surface;
   forming a plurality of first electrically conducting films to fill the respective second holes;
   removing a portion of said semiconductor substrate at the other surface thereof to reduce a thickness of said semiconductor substrate; and
   exposing said first electrically conducting film.

4. The method according to claim 1, further comprising forming a second electrically conducting film along an inside wall of said
   first hole before said providing an insulating film, wherein said forming a plurality of first electrically conducting films includes:
   exposing said second electrically conducting film on a bottom of said first hole by conducting an anisotropic etching to selectively remove the insulating film on said bottom of said first hole; and growing said first electrically conducting film from said second electrically conducting film exposed on said bottom by a plating process.

5. The method according to claim 1, wherein:
   said first hole extends through said semiconductor substrate; said plurality of first electrically conducting films constitutes a plurality of columnar electrically conducting plugs, and said insulating film is interposed between a side wall of said first hole and said plurality of columnar electrically conducting plugs, and between each adjacent pair of said plurality of columnar electrically conducting plugs.

6. The method according to claim 5, wherein at least one of said plurality of electrically conducting plugs is buried in said insulating film with an entirety of a longitudinal periphery thereof being directly in contact with said insulating film.

* * * * *